United States Patent
Otsuka et al.

(10) Patent No.: US 11,151,076 B2
(45) Date of Patent: Oct. 19, 2021

(54) VEHICLE CONTROL SYSTEM VERIFICATION DEVICE, VEHICLE CONTROL SYSTEM, AND VEHICLE CONTROL SYSTEM VERIFICATION METHOD

(71) Applicant: Hitachi Automotive Systems, Ltd., Hitachinaka (JP)

(72) Inventors: Satoshi Otsuka, Tokyo (JP); Kohei Sakurai, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 248 days.

(21) Appl. No.: 16/086,666

(22) PCT Filed: Apr. 13, 2017

(86) PCT No.: PCT/JP2017/015067
§ 371 (c)(1),
(2) Date: Sep. 20, 2018

(87) PCT Pub. No.: WO2017/187997
PCT Pub. Date: Nov. 2, 2017

(65) Prior Publication Data
US 2019/0108160 A1    Apr. 11, 2019

(30) Foreign Application Priority Data

Apr. 28, 2016 (JP) .............................. JP2016-090200

(51) Int. Cl.
*G06F 15/78* (2006.01)
*G06F 11/25* (2006.01)
(Continued)

(52) U.S. Cl.
CPC .............. *G06F 15/78* (2013.01); *B60T 17/18* (2013.01); *G05B 9/02* (2013.01); *G06F 11/22* (2013.01); *G06F 11/25* (2013.01); *G06F 30/00* (2020.01)

(58) Field of Classification Search
None
See application file for complete search history.

(56) References Cited

U.S. PATENT DOCUMENTS 6,892,317 B1 * 5/2005 Sampath ................. G06F 11/25
714/4.3
8,917,628 B2 * 12/2014 Steiner .................. H04J 3/0652
370/254
(Continued)

FOREIGN PATENT DOCUMENTS

JP    2007-506591 A    3/2007
JP    2007-528532 A    10/2007
(Continued)

OTHER PUBLICATIONS

International Search Report (PCT/ISA/210) issued in PCT Application No. PCT/JP2017/015067 dated Jun. 20, 2017 with English translation (two (2) pages).
(Continued)

*Primary Examiner* — Peter D Nolan
*Assistant Examiner* — Demetra R Smith-Stewart
(74) *Attorney, Agent, or Firm* — Crowell & Moring LLP

(57) ABSTRACT

The present invention provides a technology for comprehensive verification of the safety of the design of functions, on the basis of a safety analysis result. The disclosed vehicle control system verification device is equipped with a storage device that stores programs for verifying the safety of the logical architecture of a vehicle control system, and a processor that reads the programs from the storage device and verifies the safety of the logical architecture. On the
(Continued)

basis of safety analysis result information that is supplied, the processor executes a process for verifying whether the logical architecture has logical functions corresponding to the safety analysis result.

10 Claims, 16 Drawing Sheets

(51) Int. Cl.
*G05B 9/02* (2006.01)
*G06F 11/22* (2006.01)
*B60T 17/18* (2006.01)
*G06F 30/00* (2020.01)

(56) References Cited

U.S. PATENT DOCUMENTS

| | | | | |
|---|---|---|---|---|
| 9,195,232 | B1* | 11/2015 | Egnor | B60W 10/20 |
| 2007/0016840 | A1* | 1/2007 | Zurawka | G06F 11/008 |
| | | | | 714/776 |
| 2007/0168096 | A1 | 7/2007 | Boutin | |
| 2009/0012631 | A1* | 1/2009 | Fuller | G05B 23/0264 |
| | | | | 700/1 |
| 2009/0122812 | A1* | 5/2009 | Steiner | H04L 7/10 |
| | | | | 370/503 |
| 2010/0031212 | A1* | 2/2010 | Dong | G06F 30/00 |
| | | | | 716/100 |
| 2010/0107025 | A1* | 4/2010 | Sakada | G01R 31/3183 |
| | | | | 714/733 |
| 2015/0019187 | A1* | 1/2015 | Jones | G06F 30/20 |
| | | | | 703/8 |
| 2015/0067400 | A1* | 3/2015 | Ishii | G06F 11/079 |
| | | | | 714/37 |
| 2017/0147459 | A1* | 5/2017 | Machida | G06F 11/22 |
| 2017/0185470 | A1* | 6/2017 | Hofig | G06F 11/008 |

FOREIGN PATENT DOCUMENTS

| | | | | |
|---|---|---|---|---|
| JP | 2012-8744 | A | 1/2012 | |
| WO | WO-2005003972 | A2 * | 1/2005 | G06F 11/008 |

OTHER PUBLICATIONS

Japanese-language Written Opinion (PCT/ISA/237) issued in PCT Application No. PCT/JP2017/015067 dated Jun. 20, 2017 (five (5) pages).

Extended European Search Report issued in counterpart European Application No. 17789284.1 dated Nov. 15, 2019 (12 pages).

Ducharme et al., "CTI ISO 26262: Integration of Functional Safety into the Engineering Workflow, Integration of Functional Safety into the Engineering Workflow $2^{nd}$," Oct. 2, 2015, pp. 14-16, Detroit Marriot Troy, XP055639580, retrieved from the internet: URL:https://web.archive.org/web/20160309060235if_/http://www.kpit.com:80/downloads/medini-analyze/7-cti-jky-jbm-final-print.pdf, retrieved on Nov. 6, 2019, pp. 1-18 (24 pages).

Anonymous, "KPIT—medini analyze—Functional Safety Tool," Oct. 2, 2015, XP055639572, retrieved from the internet: URL:http://web.archive.org/web/20151002204823/http://www.kpit.com/engineering/products/medini-functional-safety-tool, retrieved on Nov. 6, 2019 (two (2) pages).

Taylor et al., "System Safety and ISO 26262 Compliance for Automotive Lithium-Ion Batteries," Product Compliance Engineering (ISPCE), 2012 IEEE Symposium ON, IEEE, Novembers, 2012, pp. 1-6, XP032293980 (six (6) pages).

* cited by examiner

FIG. 5A

| OPERATION PERFORMANCE [MHz] |
|---|
| RAM AMOUNT [KB] |
| ROM AMOUNT [KB] |
| AVAILABLE SAFETY DEGREE |
| COST [yen] |
| MULTIPLICITY |
| FAILURE RATE |
| DIAGNOSIS RATE |
| PHYSICAL DEPENDENCY |

FIG. 5B

| COMMUNICATION SPEED [bps] |
|---|
| COST [yen] |
| MULTIPLICITY |

FIG. 7A

| TYPE OF LOGICAL FUNCTION |
| --- |
| OPERATION AMOUNT [MHz equivalent] |
| CONSUMPTION RAM [KB] |
| CONSUMPTION ROM [KB] |

FIG. 7B

| TYPE OF LOGICAL FUNCTION |
| --- |
| TYPE OF SAFETY FUNCTION |
| SAFETY CONTROL MODE |
| OPERATION AMOUNT [MHz equivalent] |
| CONSUMPTION RAM [KB] |
| CONSUMPTION ROM [KB] |
| REQUIRED SAFETY DEGREE |
| DETECTION TARGET |
| DETECTION FAILURE MODE |
| DETECTION RATE |
| INDEPENDENCE REQUIREMENT |

FIG. 7C

| COMMUNICATION AMOUNT |
| --- |

FIG. 10A

| ID | UPPER EVENT | UPPER GATE | EVENT TYPE | FAILURE FUNCTION | FAILURE MODE |
|---|---|---|---|---|---|
| Top | — | — | — | — | — |
| ET1 | — | GATE1 | INTERMEDIATE | — | — |
| ET2 | — | GATE1 | INTERMEDIATE | LOGICAL FUNCTION 3 | OPERATION STOP |
| ET3 | — | GATE2 | BASIC | LOGICAL FUNCTION 1 | OPERATION STOP |
| ET4 | — | GATE2 | BASIC | Sensor1 | OPERATION ERROR |
| ET5 | — | GATE2 | BASIC | Sensor1⇒LOGICAL FUNCTION 1 | OPERATION ERROR |
| ET6 | — | GATE4 | BASIC | Sensor4 | OPERATION STOP |
| ET7 | — | GATE4 | BASIC | LOGICAL FUNCTION 1 | OPERATION ERROR |
| ET8 | — | GATE5 | BASIC | LOGICAL FUNCTION 3 | OPERATION ERROR |
| ET9 | — | GATE5 | BASIC | LOGICAL FUNCTION 4 | OPERATION ERROR |

FIG. 10B

| Id | UPPER EVENT | UPPER GATE | GATE TYPE |
|---|---|---|---|
| GATE1 | Top | — | OR |
| GATE2 | ET1 | — | OR |
| GATE3 | ET2 | — | OR |
| GATE4 | — | GATE3 | AND |
| GATE5 | — | GATE3 | OR |

| PHYSICAL ELEMENT NAME | CONNECTION DESTINATION NW | PHYSICAL PARAMETER |
|---|---|---|
| XXX | NW_A | .... |
| YYY | NW_A, NW_B | .... |
| ZZZ | NW_B, NW_C | .... |
| WWW | XXX | .... |

| ID | ALLOCATION PLACE | LOGICAL PARAMETER |
|---|---|---|
| AAA | XXX | .... |
| BBB | YYY | .... |
| CCC | YYY | .... |
| DDD | XXX | .... |
| EEE | ZZZ | .... |

VEHICLE CONTROL SYSTEM VERIFICATION DEVICE, VEHICLE CONTROL SYSTEM, AND VEHICLE CONTROL SYSTEM VERIFICATION METHOD

TECHNICAL FIELD

The present disclosure relates to a vehicle control system verification device, a vehicle control system, and a vehicle control system verification method.

BACKGROUND ART

In recent years, electronic control of an automobile has been rapidly complicated, and it is necessary to cope with the complicated electronic control. A more reliable vehicle control system is desired. To realize such as vehicle control system, it is desirable to inspect reliability of each function implemented in the vehicle control system.

For example, PTL 1 discloses that safety and reliability of a software-based electronic system are examined based on a hardware component of a system which is required for a function by using the reliability function to examine a required function of a system. Furthermore, PTL 2 discloses an improved method for design and verification of a safety-oriented system. According to PTL 1 or 2, regarding requirements related to the safety and the reliability, it is possible to design an architecture and examine and verify a content of an implementation.

CITATION LIST

Patent Literature

PTL 1: JP 2007-506591 A
PTL 2: JP 2007-528532 A

SUMMARY OF INVENTION

Technical Problem

However, PTLs 1 and 2 do not disclose that safety function requirements are comprehensively verified from safety analysis result (also referred to as safety analysis information) and a relationship between the safety functions is verified other than the multiplicity in the reliability (multiplicity is described in PTL 1). Therefore, the technologies disclosed in PTLs 1 and 2 are not sufficient for verification of each function of the vehicle control system.

The present disclosure has been made in consideration of the above state and provides a technology for comprehensively verifying the safety of design of the function based on the safety analysis result.

Solution to Problem

To solve the above problems, as one aspect of the present disclosure, for example, the technical ideas described in claims may be used. Specifically, the vehicle control system verification device according to the present disclosure includes a storage device that stores programs for verifying safety of a logical architecture of a vehicle control system and a processor that reads the programs from the storage device and verifies the safety of the logical architecture. On the basis of information on the safety analysis result information that is supplied, the processor executes a process for verifying whether the logical architecture has logical functions corresponding to the safety analysis result.

Further features related to the present disclosure will be apparent with reference to the description herein and the accompanying drawings. Furthermore, the aspects of the present disclosure are achieved and realized by elements and combinations of various elements, detailed description below, and aspects in the attached claims.

The description in the specification is merely exemplary, and it is necessary to understand that the description herein does not limit the scope of claims of the present disclosure and application examples in any way.

Advantageous Effects of Invention

According to the present disclosure, a design based on a logical architecture, a physical architecture, and function allocation information of an automatic operation system can be comprehensively verified on the basis of safety analysis information.

BRIEF DESCRIPTION OF DRAWINGS

FIGS. 5A and 5B are diagrams illustrating an example of parameters of a physical architecture 20.

FIGS. 7A to 7C are diagrams illustrating an example of parameters of the logical architecture 601.

FIGS. 10A and 10B are diagrams illustrating an example of parameters applied to each event and each gate of the FTA.

DESCRIPTION OF EMBODIMENTS

A vehicle control system verification device according to embodiments of the present disclosure comprehensively verifies safety of a design of functions and appropriateness of allocation on the basis of safety analysis result that is supplied and verifies whether necessary requirements are satisfied and whether safety functions are cooperated with each other. Specifically, the vehicle control system verification device according to the present disclosure verifies whether a logical architecture of a vehicle control system has logical functions coping with the safety analysis result on the basis of the safety analysis result (FTA) information that is supplied. Note that the logical architecture may be constructed on the basis of the safety analysis result information. This is because the verification of the safety function at the time of design is to design an architecture so as to satisfy the safety requirements of the FTA and to check whether the architecture actually satisfies the safety requirements of the FTA to be a target.

Furthermore, the vehicle control system verification device verifies whether a physical architecture of the vehicle control system satisfies a safety degree and multiplicity required by the logical architecture.

Hereinafter, preferred embodiments of the present invention will be described in more detail. In the embodiments, a verification device of a vehicle control system is mainly described, and the embodiment is preferable for the verification of the vehicle control system. However, this is not intended to prevent an application of the embodiments to the other systems.

(1) First Embodiment

A first embodiment discloses verification whether a safety function required for the FTA exists in a logical architecture of a vehicle control system and whether a safety degree and multiplicity required for the physical architecture are satisfied when the logical architecture is allocated in the physical architecture of the vehicle control system.

<Vehicle Control System Verification Device>

Figure 1:
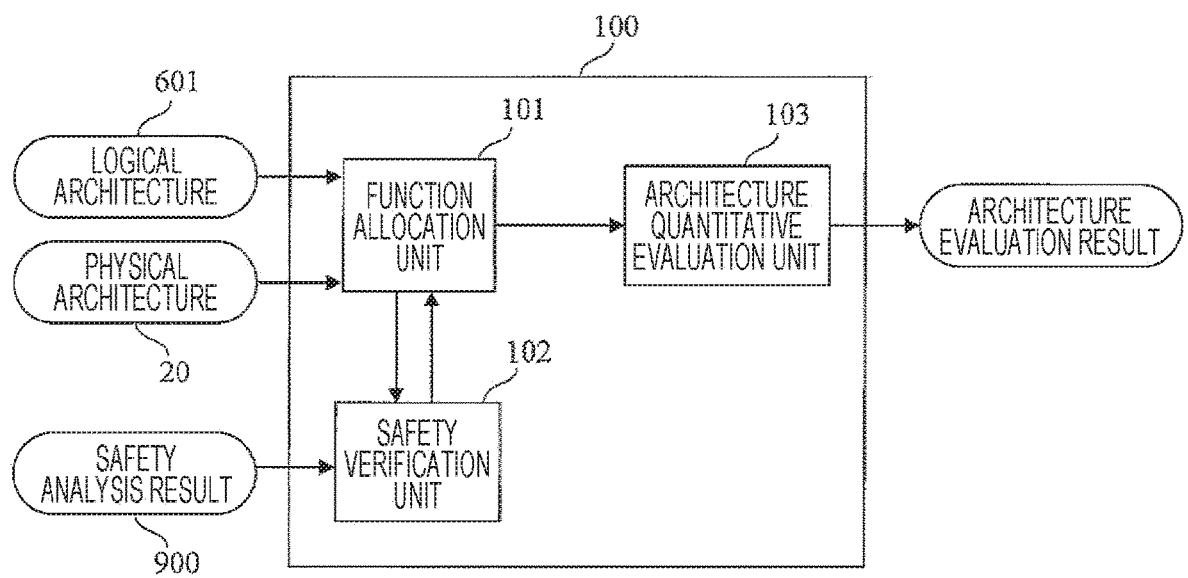
FIG. 1 is a diagram illustrating a schematic configuration of a vehicle control system verification device 100 according to an embodiment of the present disclosure.

FIG. 1 is a diagram illustrating a schematic configuration of a vehicle control system verification device 100 according to an embodiment of the present disclosure.

The vehicle control system verification device 100 includes a function allocation unit 101, a safety verification unit 102, and an architecture quantitative evaluation unit 103.

Figure 8:
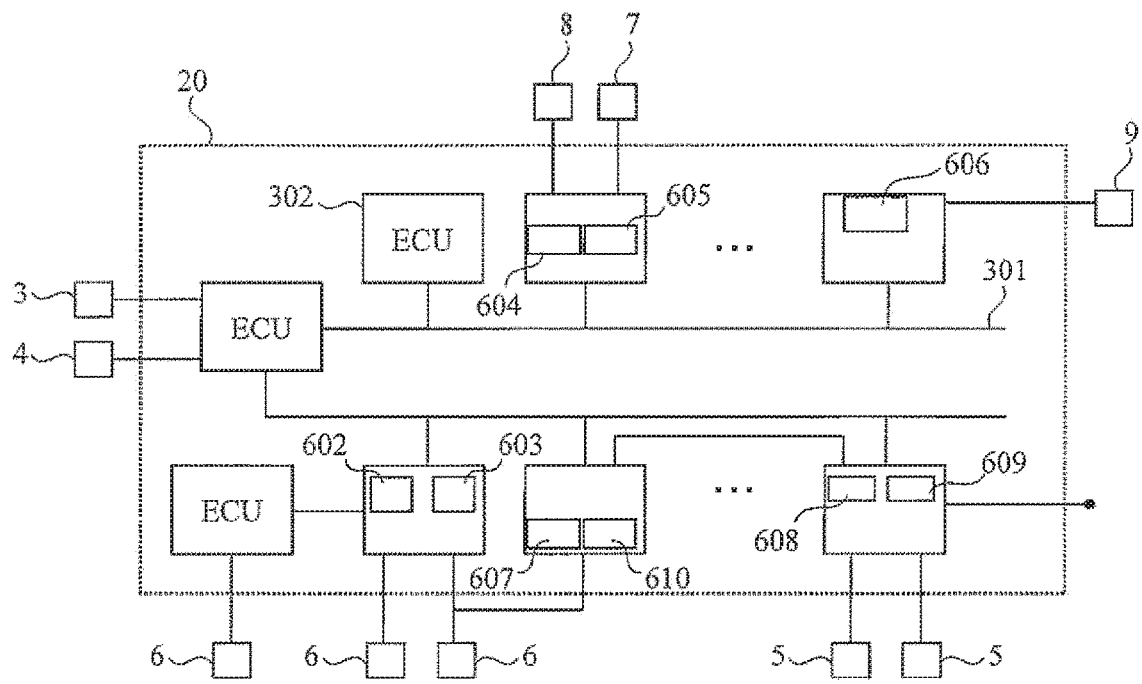
FIG. 8 is a diagram illustrating an exemplary configuration of a case where a logical architecture is allocated in a physical architecture.

For example, the function allocation unit 101 receives the logical architecture 601 and the physical architecture 20, and executes a process for allocating the logical architecture 601 in the physical architecture 20 as in an example of function allocation (refer to FIG. 8).

The safety verification unit 102 receives the architecture after function allocation and safety analysis information (for example, Fault Tree Analysis (FTA) (refer to FIG. 9)) 900 and verifies safety of the architecture designed according to a flow of safety verification proposed in the present disclosure. Then, the safety verification unit 102 outputs that the safety verification is OK or the safety verification is not OK and the reason for the same as verification result to the function allocation unit 101. Note that the verification result may be directly output to the architecture quantitative evaluation unit 103.

The architecture quantitative evaluation unit 103 receives the verification result of the safety of the architecture and performs quantitative evaluation mainly on the architecture of which the safety verification has been determined as OK and outputs evaluation result.

As described above, the vehicle control system verification device 100 verifies and evaluates the vehicle control system.

The vehicle control system verification device 100 may be realized by a computer including a processor (CPU and the like), a memory (ROM, RAM, and the like), and the like. In this case, the function allocation unit 101, the safety verification unit 102, and the architecture quantitative evaluation unit 103 are configured by programs, and the processor reads various programs from a program memory (ROM) and executes the read program.

Details of the logical architecture 601, the physical architecture 20, the function allocation unit 101, and the safety verification unit 102 will be described later.

<Configuration of Vehicle Control System>

Figure 2:
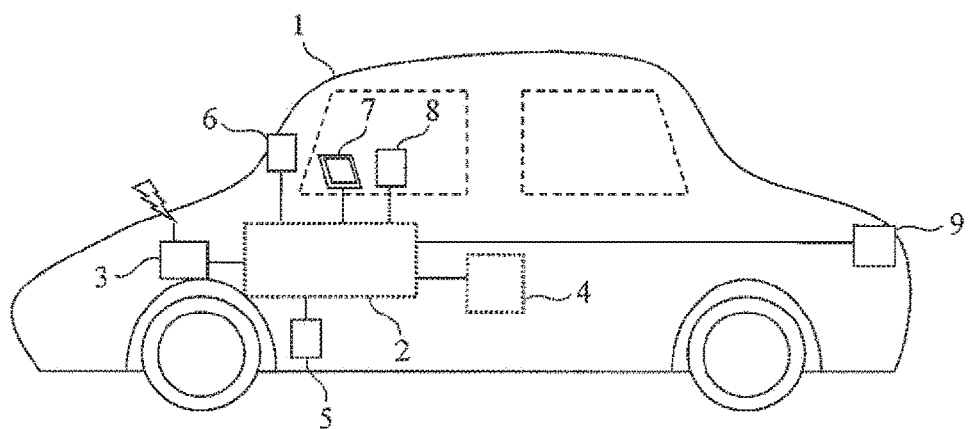
FIG. 2 is a diagram illustrating an exemplary schematic configuration of a vehicle system 1 including a vehicle control system to be evaluated.

FIG. 2 is a diagram illustrating an exemplary schematic configuration of a vehicle system 1 including a vehicle control system to be evaluated. The vehicle system 1 corresponds to an automobile and the like, and includes the vehicle control system therein.

For example, the vehicle system 1 includes a first vehicle control system 2, at least one communication device 3, a second vehicle control system 4, at least one driving device 5, at least one recognition device 6, an output device 7, an input device 8, and a notification device 9. Here, two vehicle control systems (first vehicle control system 2 and second vehicle control system 4) are exemplified. However, the number of vehicle control systems is not limited to two. Furthermore, a configuration in which a plurality of vehicle control systems is operated in cooperation with each other may be employed.

The first vehicle control system 2 includes, for example, an in-vehicle network (Controller Area Network (CAN), CAN with Flexible Data-rate (CANFD), Ethernet (registered trademark), and the like) and a controller (Electronic Control Unit (ECU) and the like). The first vehicle control system 2 is connected to the second vehicle control system 4, the communication device 3, the driving device 5, the recognition device 6, the output device 7, the input device 8, and the notification device 9 and exchanges information with each of the devices.

The communication device 3 performs wireless communication to outside of the vehicle system 1 (for example, communication with mobile phone, communication using a protocol such as wireless LAN, WAN, and Car to X (C2X: vehicle-to-vehicle or vehicle-to-infrastructure communication, or communication using Global Positioning System (GPS)), performs wireless communication to obtain or transmit information on the outside (for example, infrastructure, other vehicle, and map) or information on the vehicle itself (for example, information indicating state of vehicle), or has a diagnostic terminal (OBD), an Ethernet (registered trademark) terminal, an external recording medium (for example, USB memory and SD card) terminal, and the like to communicate with the first vehicle control system 2.

For example, the second vehicle control system 4 is a vehicle control system including a network using a protocol different from or same as that of the first vehicle control system 2.

The driving device 5 drives machines and electric devices for controlling an vehicle motion (for example, engine, transmission, wheel, brake, and steering device) according to the control of the first vehicle control system 2 and corresponds to, for example, an actuator.

The recognition device 6 includes an external sensor such as a camera, a radar, an LIDAR, an ultrasonic sensor, and the like that outputs information to obtain information input from outside and to generate information and a dynamical system sensor that recognizes a state of the vehicle system 1 (motion state, position information, acceleration, wheel speed, and the like).

The output device 7 is connected to a network system (for example, the in-vehicle network) in a wired or wireless manner, receives data transmitted from the network system, and displays or outputs necessary information such as message information (for example, video, sound). For example, the output device 7 corresponds to a liquid crystal display, a warning lamp, a speaker, and the like.

The input device 8 generates an input signal to input an intention and an instruction of an operation to the first vehicle control system 2 by a user and corresponds to, for example, a steering, a pedal, a button, a lever, and a touch panel.

The notification device 9 is used to notify outside of a state of the vehicle and the like by the vehicle system 1 and corresponds to, for example, a lamp, an LED, and a speaker.

<Example of Physical Architecture>

Figure 3:
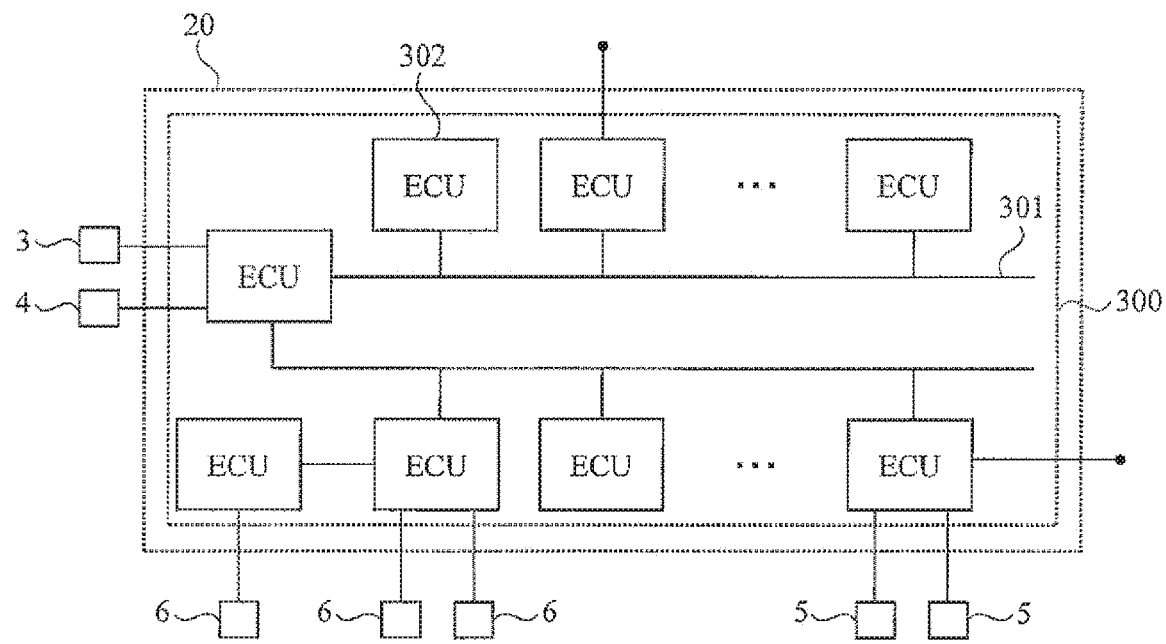
FIG. 3 is a diagram illustrating an example of a physical architecture of a vehicle control system 2.

FIG. 3 is a diagram illustrating an example of a physical architecture of the vehicle control system 2. The physical architecture 20 can be referred to as a hardware (H/W) configuration.

The physical architecture 20 includes, for example, a network link 301 and Electronic Control Units (ECU) 302.

The network link 301 is a network link to connect network devices on the in-vehicle network and corresponds to, for example, a network link such as a CAN bus.

The ECU 302 is connected to the network link 301, the driving device 5, the recognition device 6, and a network link (including dedicated line) other than 301 to control the driving device 5 and the recognition device 6, to obtain information, and to exchange data with the network. The ECU 302 is connected to the plurality of network links 301 and plays a role of a gateway (referred to as GW below) for exchanging data with each of the network links.

Other than a bus-type example in which the plurality of ECUs is connected to two buses illustrated in FIG. 3, as an exemplary configuration of a network topology, a star type in which the plurality of ECU is directly connected to the GW, a link type in which the ECUs are connected in a ring-like shape as a string of link, and a mixed type in which various types are mixed and the plurality of networks is included can be employed. Based on the data received from the network, the ECU 302 executes control processing such as to output a control signal to the driving device 5, to obtain information from the recognition device 6, to output the control signal and the information to the network, and to change an internal state.

Here, the ECU 302, the network link 301, and the processor in the ECU may also be referred to as physical elements below.

<Internal Configuration Example of ECU>

Figure 4:
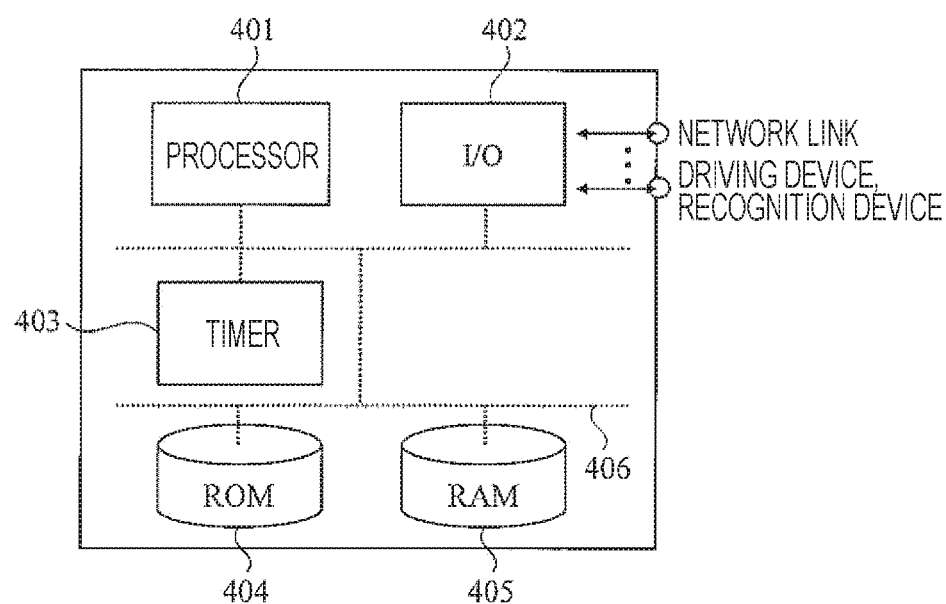
FIG. 4 is a diagram illustrating an internal configuration example of an ECU 302.

FIG. 4 is a diagram illustrating an internal configuration example of the ECU 302. The ECU 302 includes, for example, a processor 401, an Input/Output (I/O) device 402, a timer 403, a Read Only Memory (ROM) 404, a Random Access Memory (RAM) 405, and an internal bus 406 as the internal configuration.

The processor 401 includes a storage element such as a cache and a register and performs control. For example, the processor 401 includes a CPU. The processor 401 executes a logical function to be described later.

The I/O device 402 exchanges data with the network link 301 or the driving device 5 or/and the recognition device 6 connected via the network or a dedicated line. The I/O device 402 can include, for example, a communication interface (I/F).

The timer 403 uses a clock (not shown) or the like to manage time.

The ROM 404 stores a program and nonvolatile data. The RAM 405 stores programs and volatile data. The internal bus 406 is used for communication in the ECU 302.

<Parameters of Physical Architecture>

FIG. 5 is a diagram illustrating an example of parameters of the physical architecture 20. FIG. 5A illustrates parameters applied to the physical elements (ECU and processor) of the physical architecture 20. FIG. 5B illustrates parameters applied to the network.

(i) Parameters of Physical Element

As illustrated in FIG. 5A, the parameters of the physical element include an operation performance, a RAM amount, a ROM amount, an available safety degree, a cost, a multiplicity, a failure rate, a diagnosis rate, and physical dependency. In the parameters, the operation performance (MHz: performance of processor), the RAM amount (KB: capacity), the ROM amount (KB: capacity), and the cost (yen: price of ECU or processor) are used in quantitative evaluation of an architecture having the parameters of the ECU or the processor.

The available safety degree is a parameter related to safety and information indicating a safety level with which the physical element can cope as hardware (ECU). The available safety degree is specified in ISO26262 and corresponds to, for example, the Automotive Safety Integrity Level (ASIL) and the Quality Management (QM).

The multiplicity is information indicating the number of systems included in the ECU. For example, if the ECU has a dual system and can cape with a failure of one system, it is assumed that the multiplicity be two (the number of multiplicities).

The failure rate is information indicating time in which a single failure occurs when the physical element (ECU and processor) continuously operates (Failure in time) and used for safety verification.

The diagnosis rate indicates a coverage of diagnosis regarding a function of the physical element (for example, microcomputer diagnosis). For example, this indicates that the physical element can cope with 99% of failures and cannot cope with remaining one % of failures if the diagnosis rate is 99%. The failure with which the physical element cannot cope may be recognized at the time of design.

The physical dependency is information indicating the hardware on which the physical element depends (for example, a case where ECU and another ECU are connected to the same power supply).

As illustrated in FIG. 4, in a case where a microcomputer (processor) is arranged in the ECU, the parameter is applied to one of the ECU and the processor at the time of verification, and the applied parameter is used. In a case where the parameters are applied to both of the ECU and the microcomputer in this way, in consideration of the safety, the parameter which outputs worse result (for example, lower value as ASIL) is used for the verification. Accordingly, high verification result is not wrongly output, and safety as a whole can be secured.

Here, regarding the failure rate and the diagnosis rate, an example in which the same parameters are applied to all the failure modes is described. However, different parameters may be used for the respective failure modes of each element. By using the parameters in this way, the verification and the evaluation based on the failure rate and the diagnosis rate according to the failure mode are available, and more detailed quantitative evaluation and verification can be realized.

(ii) Network Parameters

As illustrated in FIG. 5B, the network includes parameters of a communication speed (bps), a cost (yen: price of network cable), and multiplicity (communication line redundancy).

<Logical Architecture>

Figure 6:
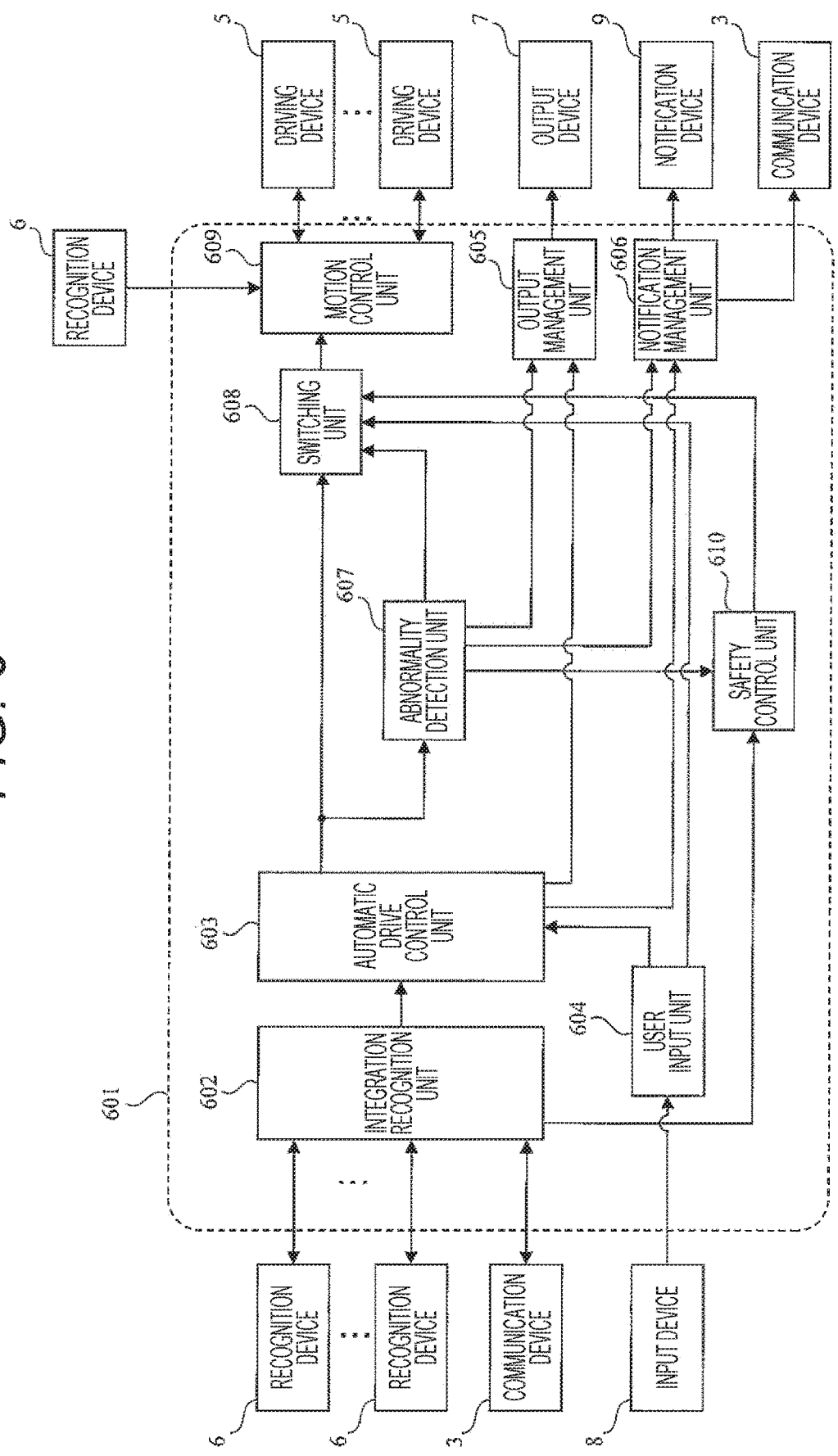
FIG. 6 is a diagram illustrating an exemplary configuration of a logical architecture 601 of the vehicle control system (for example, first vehicle control system 2).

FIG. 6 is a diagram illustrating an exemplary configuration of the logical architecture 601 of the vehicle control system (for example, first vehicle control system 2).

The logical architecture 601 of the vehicle control system includes, for example, an integration recognition unit 602, an automatic drive control unit 603, a user input unit 604, an output management unit 605, a notification management unit 606, an abnormality detection unit 607, a switching unit 608, a motion control unit 609, and a safety control unit 610.

The integration recognition unit 602 executes a process for creating an outside recognition map formed by integrating outside recognition information transmitted from the plurality of recognition devices 6 and the communication device 3.

The automatic drive control unit 603 generates automatic drive control information (trajectory and the like) based on the outside recognition map generated by the integration recognition unit 602 and a user input from the user input unit 604 and outputs the generated information to the abnormality detection unit 607 and the switching unit 608. Furthermore, the automatic drive control unit 603 issues an output instruction to the output management unit 605 and issues a notification instruction to the notification management unit 606. The output management unit 605 issues an output instruction to the output device 7 according to the outputs of the automatic drive control unit 603 and the abnormality detection unit 607. The notification management unit 606 issues a notification instruction to the notification device 9 according to the outputs of the automatic drive control unit 603 and the abnormality detection unit 607.

The user input unit 604 generates user instruction information according to the input from the input device 8.

The abnormality detection unit 607 detects an abnormality on the basis of the automatic drive control information and the like from the automatic drive control unit 603 and predetermined information from each unit which is not shown and outputs abnormality detection result to the switching unit 608, the safety control unit 610, the output management unit 605, and the notification management unit 606.

According to the abnormality detection result of the abnormality detection unit 607 and the like, the switching unit 608 switches an output to the motion control unit 609 to an input from the automatic drive control unit 603, an input from the user input unit 604, or an input from the safety control unit 610. Specifically, when the abnormality detection unit 607 detects an abnormality, a normal control system (also referred to as main control system: 602→603→608→609) from the automatic drive control unit 603 is switched to a control system at the time of abnormality (also referred to as safe control system: 602→610→608→609).

The motion control unit 609 controls the plurality of driving devices 5 according to trajectory information or motion control information provided from the switching unit 608, the state of the vehicle system 1 obtained from the recognition device 6, and a response from the driving device 5.

The safety control unit 610 performs control in a case of receiving a notification that the abnormality has been detected. The safety control unit 610 has a degeneracy function of the automatic drive control unit 603 and can alternatively execute a part of the function of the automatic drive control unit 603 in an emergency.

In the example illustrated in FIG. 6, a function for performing main control at the normal time is referred to as a main function, and a function for performing main control at the time of detecting the abnormality or at the time after the abnormality has occurred is referred to as a safety function. The main function corresponds to the integration recognition unit 602, the automatic drive control unit 603, the user input unit 604, the output management unit 605, the notification management unit 606, and the motion control unit 609. The safety function corresponds to the abnormality detection unit 607, the switching unit 608, and the safety control unit 610.

<Parameters of Logical Architecture>

FIG. 7 is a diagram illustrating an example of parameters of the logical architecture 601. FIG. 7A illustrates parameters applied to the main functions. FIG. 7B illustrates parameters applied to the safety functions. FIG. 7C illustrates a parameter for logical connection.

(i) Main function Parameters

The parameters of the main function include a type of a logical function, an operation amount, a consumption RAM, and a consumption ROM.

The type of the logical function is information indicating the type of the logical function and used for determination of the main function or the safety function. Here, the "main function" is input.

The operation amount (MHz) is information indicating a performance of the ECU or the processor necessary for executing the function. The consumption RAM (KB) is information indicating a consumption amount of the RAM necessary for executing the function. The consumption ROM (KB) is information indicating a consumption amount of the ROM necessary for executing the function.

The operation amount, the consumption RAM, and the consumption ROM are mainly used for quantitative evaluation of the architecture.

(ii) Safety Function Parameters

The parameters of the safety function include a type of the logical function, a type of the safety function, a safety control mode, an operation amount, a consumption RAM, a consumption ROM, a required safety degree, a detection target, a detection failure mode, a detection rate, and an independence requirement.

The type of the logical function is information indicating the type of the logical function and used for determination of the main function or the safety function. Here, the "safety function" is input. The operation amount (MHz) is information indicating a performance of the ECU or the processor necessary for executing the function. The consumption RAM (KB) is information indicating a consumption amount of the RAM necessary for executing the function. The consumption ROM (KB) is information indicating a consumption amount of the ROM necessary for executing the function. The operation amount, the consumption RAM, and the consumption ROM are mainly used for quantitative evaluation of the architecture. The type of the logical function, the operation amount, the consumption RAM, the consumption ROM are used for the quantitative evaluation of the architecture similarly to the main function.

The type of the safety function is information indicating the type of the corresponding safety function and used for determination safety function cooperation to be described later. For example, the type of the safety function indicates which one of detection, control, and switch the safety function corresponds to.

The safety control mode is information indicating a content required for safety control to be realized by the safety function. For example, information such as function stop and function continuation is applied. In addition, the safety control mode includes information on the required multiplicity.

The required safety degree is information indicating a safety degree required for the safety function. For example, QM and ASIL are applied, and execution of the safety function with the safety degree is required in the physical architecture.

The detection target is information indicating a logical function of which an event (for example, abnormality) is a detection target to be detected by the safety function. For example, when the function is the abnormality detection unit 607, the detection target is the integration recognition unit 602 and the automatic drive control unit 603.

The detection failure mode is information indicating a failure mode from among the plurality of failure modes (for example, stop at the time of failure, output false value at the time of failure, output value with delay at the time of failure, and the like) corresponding to the logical function.

The detection rate is information indicating whether a range of failures and errors can be detected by the safety function as in the "diagnosis rate" of the physical element. For example, in a case where the detection rate is 99%, although 99% of the failures and errors can be detected, remaining one % of the failures and errors cannot be detected.

The independence requirement is information indicating a name of a logical function which should not be failed at the same time as the time of the failure of the safety function. The independence requirement is a parameter to prevent the design such as a common-cause failure and a subordinate failure in which failures concurrently occur in the safety function and the main function, resulting in unavailability in the safety control.

(iii) Logical Connection Parameter

A parameter relative to logical connection includes a communication amount of the communication path. The communication amount is used for the quantitative evaluation of the architecture.

(iv) Regarding the parameters described above, there are essential combinations at the time of architecture design. Therefore, when the essential parameters are not applied, it is necessary to determine that the architecture verification is not OK. For example, in spite of the type of the safety function which is "detection", in a case where the parameters such as the detection target, the detection failure mode, the detection rate, and the like are not applied, Not OK is output at the time of safety verification.

<Function Allocation Example>

FIG. 8 is a diagram illustrating an exemplary configuration of a case where a logical architecture is allocated in a physical architecture.

The function allocation unit 101 allocates the applied logical architecture 601 (refer to FIG. 6) in the applied physical architecture 20 (refer to FIG. 3). As a result, the physical element (ECU and microcomputer) which executes a process of the logical function, the logical function to be processed, and the content of the communication in the network are determined.

In the allocation example in FIG. 8, the logical functions having strong relationships with each other are allocated in the same ECU. For example, the integration recognition unit 602, the automatic drive control unit 603, the user input unit 604, and the output management unit 605 which are the main functions are allocated in the same ECU. The abnormality detection unit 607 and the safety control unit 610 which are the safety functions are allocated in the same ECU. Furthermore, the switching unit 608 which is the safety function and the motion control unit 609 which is the main function are allocated in the same ECU.

Note that a plurality of paths is provided in the network between the logical functions, for example, it is preferable to perform efficient communication by selecting a path that causes the minimum cost (communication band, the number of hops) from among the provided paths.

<Safety Analysis Information>

Figure 9:
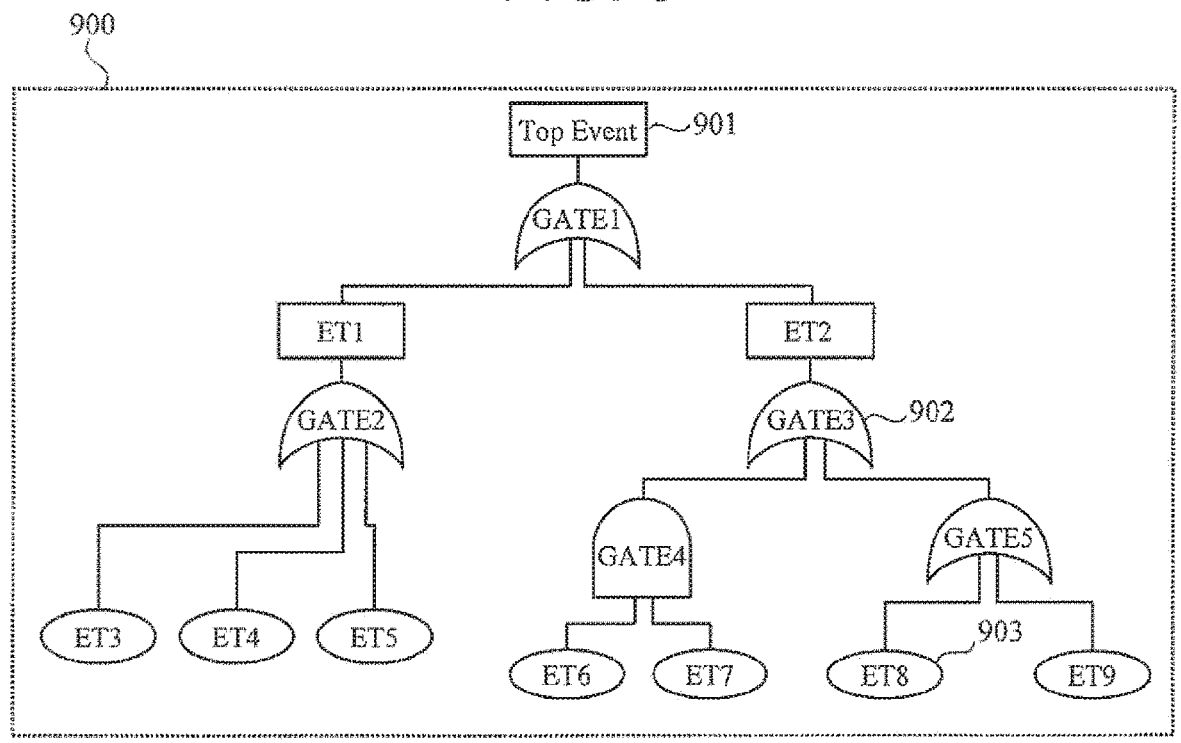
FIG. 9 is a diagram illustrating an example of Fault Tree Analysis (FTA) that can be used as safety analysis information.

FIG. 9 is a diagram illustrating an example of Fault Tree Analysis (FTA) that can be used as safety analysis information. A FTA 900 has a tree-like structure and includes a top event 901, events 903 which form respective leaves, and branch gates 902.

The top event (event at top of tree) is considered as a hazard event (dangerous event), coupled to lower events through AND gates or OR gates, and decomposed into the lower events which cause the top event. The OR gate means that the upper event occurs when one of the events occurs, and the AND gate means that the upper event occurs only when both of the events occur. In this way, relationship between the events that cause the highest hazard can be clarified.

<Parameters of Event and Gate>

FIG. 10 is a diagram illustrating an example of parameters applied to each event and each gate. FIG. 10A illustrates parameters applied to each event. FIG. 10B illustrates the parameters applied to each gate.

(i) Parameters of Event

The parameters of the event include an event or a gate positioned on the upper side of the event (upper event or upper gate), an event type (intermediate event or basic event), a failure function, and a failure mode as configuration items. A combination of the failure function and the failure mode represents a content of the event. The failure function and the failure mode are described not only in the basic event but also in the intermediate event. With this description, for example, not only a failure of a component but also a system failure can be described.

Regarding the failure function, a table (not shown) indicating the content of the logical function is additionally provided, and the content of each logical function can be recognized with reference to the table.

(ii) Parameters of Gate

The parameters of the gate include an event and a gate positioned on the upper side of each gate and a gate type (OR or AND) as configuration items.

(iii) With the above parameters, in a case where any one of events (failure in logical function) occurs, a condition which causes the hazard can be expressed.

<Safety Verification Processing>

Figure 11:
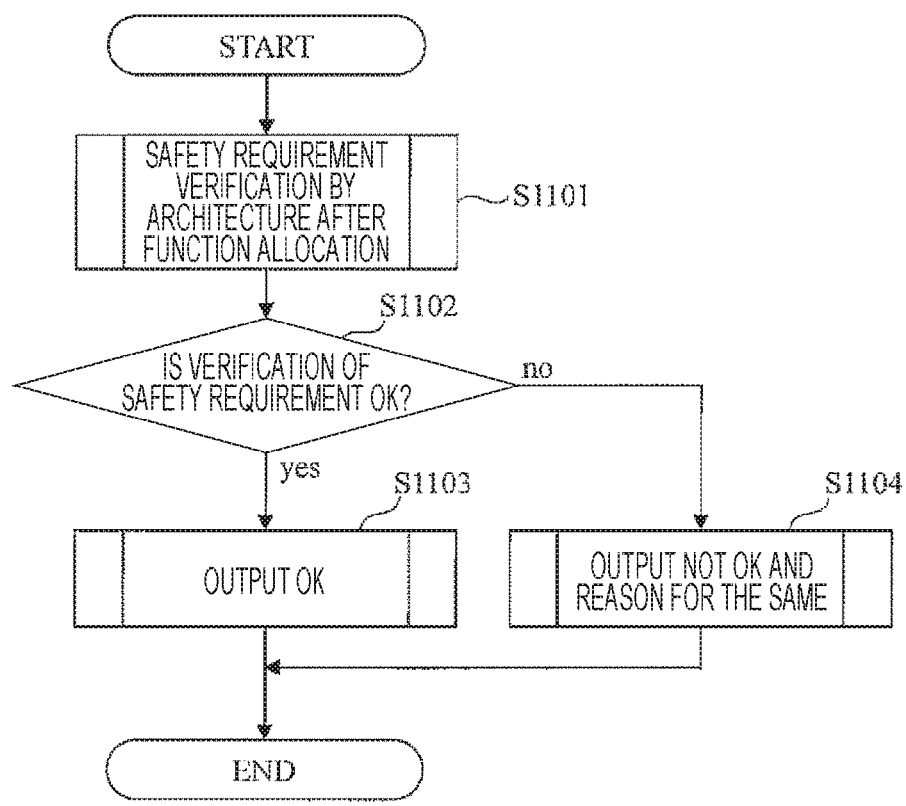
FIG. 11 is a flowchart for explaining an outline of safety verification processing according to a first embodiment.

FIG. 11 is a flowchart for explaining an outline of safety verification processing according to the first embodiment. An outline of the processing to be performed by the safety verification unit 102 as a program will be described below. However, since the program is read and executed by the processor of the vehicle control system verification device 100, the safety verification unit 102 can be replaced with the "processor".

(i) Step 1101

First, the safety verification unit 102 executes the safety requirement verification processing on an architecture after function allocation. Details of the safety requirement verification processing will be described later (refer to FIG. 12).

(ii) Step 1102

In a case where safety requirement verification result is OK (yes in S1102), the safety verification unit 102 proceeds the processing to step 1103, and in a case where the safety requirement verification result is not OK (no in S1102), the safety verification unit 102 proceeds the processing to step 1104.

(iii) Step 1103

The safety verification unit 102 outputs OK as the safety verification result and terminates the processing.

(iv) Step 1104

The safety verification unit 102 outputs the result of not OK, a reason for the same, and the safety requirement of which the verification has not been valid. In this way, the safety requirements are verified.

<Safety Requirement Verification Processing>

Figure 12:
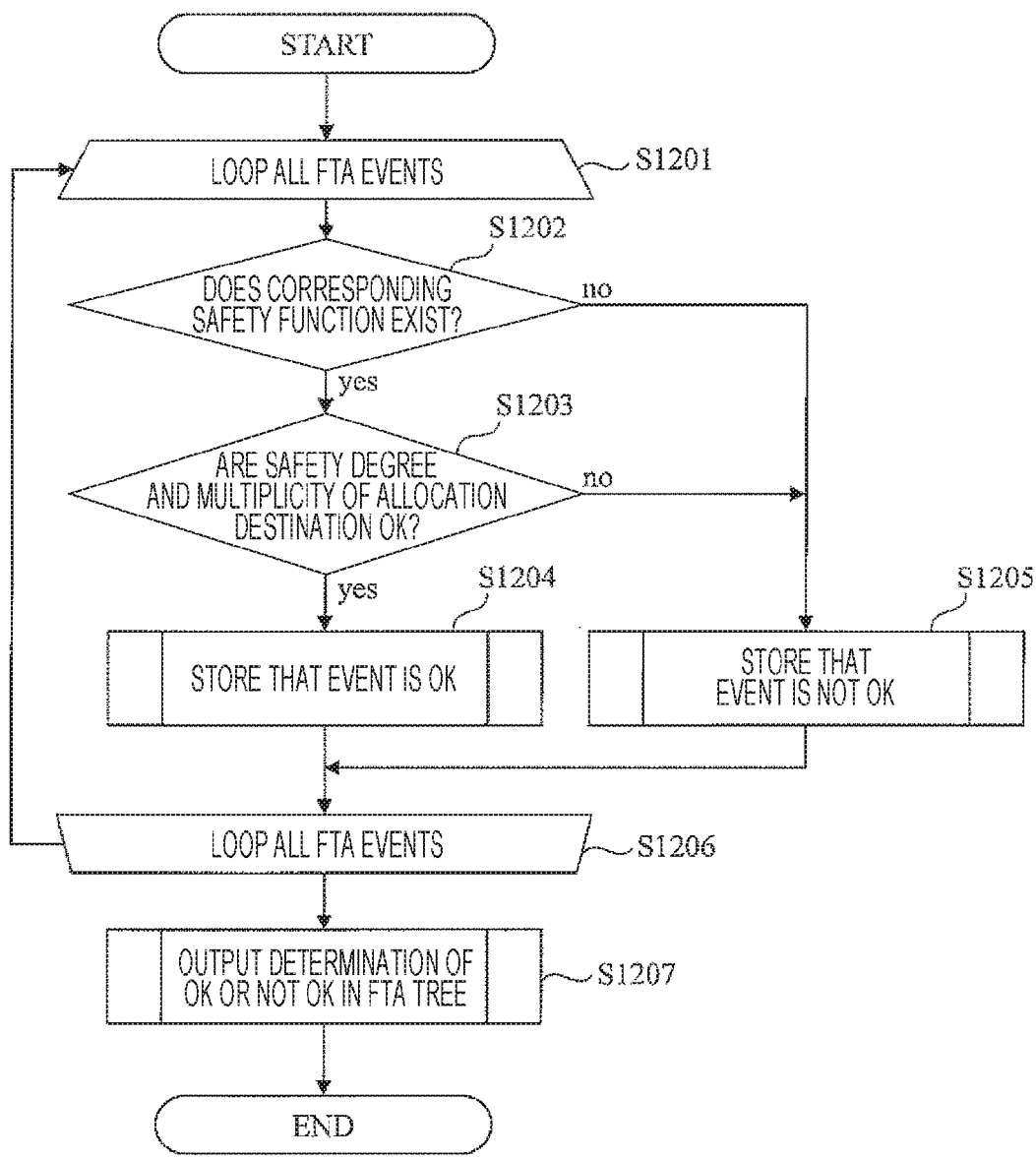
FIG. 12 is a flowchart for explaining details of safety requirement verification processing (step 1102).

FIG. 12 is a flowchart for explaining the details of the safety requirement verification processing (step 1102).

(i) Step 1201

In the safety requirement verification processing, the safety verification unit 102 repeats processing in steps 1202 to 1205 on all the events of the safety analysis information 900.

(ii) Step 1202

For each event, the safety verification unit 102 confirms whether the corresponding safety function exists on the architecture. Specifically, it is checked whether the parameter of the failure function (for example, logical function 1 in FIG. 10) of the event (for example, ET3) (to be processed) exists in the detection failure mode and the detection target of the corresponding safety function. In a case where the corresponding safety function exists (yes in step 1202), the processing proceeds to step 1203. In a case where there is no corresponding safety function (no in step 1202), the processing proceeds to step 1205.

(iii) Step 1203

The safety verification unit 102 determines whether requirements in the safety degree and the multiplicity are satisfied in the allocation destination of the safety function in the physical architecture 20.

In a case of the safety, in a case where a value of the required safety degree which is the parameter of the safety function is smaller than or equal to the available safety degree of the physical element of the allocation destination, it is determined that the required safety degree is OK. Specifically, in a case where the required safety degree of the safety function is ASIL-C, if the available safety degree of the physical element of the allocation destination is the ASIL-C or equal to or more than that (ASIL-D and the like), it is determined that the required safety degree is OK.

In a case of the multiplicity, in a case where a value of required multiplicity included in the safety control mode which is the parameter of the safety function is smaller than or equal to the multiplicity of the physical element of the allocation destination, it is determined that the multiplicity is OK. Specifically, in a case where the required multiplicity of the safety function is two, if the multiplicity of the physical element of the allocation destination is equal to or more than two, it is determined that the multiplicity is OK.

In a case where the safety degree and the multiplicity of the allocation destination are OK (yes in step 1203), the processing proceeds to step 1204. In a case where the safety degree and the multiplicity of the allocation destination are not OK (no in step 1203), the processing proceeds to step 1205.

(iv) Step 1204

The safety verification unit 102 determines that the content of the event is OK.

(v) Step 1205

The safety verification unit 102 determines that the content of the event is not OK.

(vi) Step 1206

The safety verification unit 102 executes processing on the next event. After processing on all the events has been completed, the processing proceeds to step 1207.

(vii) Step 1207

The safety verification unit 102 makes determination on the safety requirement verification by applying the processing results of steps 1201 to 1206 to the tree of the FTA. Specifically, for each event of the FTA, the safety verification unit 102 inputs the results indicating OK or not OK regarding each event to the FTA and makes determination according to the tree of the FTA. That is, as passing through OK and not OK in the tree from each event to the top, determination at each gate is made as AND or OR, and it is determined whether the highest event occurs. Here, the safety verification unit 102 makes determination with an AND condition and an OR condition as setting not OK as T (True) and OK as F (False). Then, OK is returned in a case where the top event is False, and not OK is returned in a case of True. The overall safety requirement is verified in this way.

In a case where the top event is not OK, all the recorded events which are not OK are returned. With this processing, the vehicle control system verification device 100 can present the safety requirement having an error relative to a user.

(viii) Modification

In step 1203, only the determination on the safety degree may be made in the verification processing of the allocation destination. Since the multiplicity is additionally verified in the safety function cooperation, the verification of the multiplicity can be omitted in step 1203. With this omission, an operation amount can be reduced.

Furthermore, in step 1207, the determination in the FTA tree is not made, and in a case where any one of the events is not OK, it is possible to determine that the safety requirement verification is not OK based on the result and to terminate the safety requirement verification processing. By determining that the safety function should correspond to all the safety requirements, processing time can be reduced without performing an operation of the FTA tree.

<Architecture Quantitative Evaluation>

The architecture quantitative evaluation unit 103 performs quantitative evaluation on an architecture to which functions have been allocated and of which the safety verification result has been determined to be OK. The quantitative evaluation can be realized by, for example, calculating a use rate of the logical function on the physical element, calculating an occupancy rate in communication, and calculating a cost of the physical element. The use rate of the logical function on the physical element can be calculated by calculating a total value of each of the operation amount, the consumption RAM, and the consumption ROM regarding each of the plurality of logical functions arranged in the physical element of the physical architecture 20 and calculating the use rate on the physical element. Furthermore, the occupancy rate in communication can be calculated by summing up use amounts of communication of each logical function on the network and calculating the occupancy rate. In addition, the cost of the physical element can be calculated by adding costs of physical elements used in the entire physical architecture, that is, the cost of the physical elements in which one or more logical functions are allocated.

With this calculation, the quantitative evaluation on the architecture of which the safety has been verified can be performed. The quantitative evaluation may be performed only on the architectures of which the safety has been verified. With this evaluation, it is possible to reduce unnecessary evaluation time of the architecture of which the safety is not satisfied.

(2) Second Embodiment

A second embodiment discloses another form of verification and evaluation based on quantitative evaluation of safety. Specifically, the safety requirement verification (step 1101) according to the first embodiment or another form of the processing (safety quantitative evaluation processing: can be referred to as top event occurrence probability calculation processing) executed in the architecture quantitative evaluation described above will be described.

<Outline of Safety Quantitative Evaluation Processing (Top Event Occurrence Probability Calculation Processing)>

Figure 13:
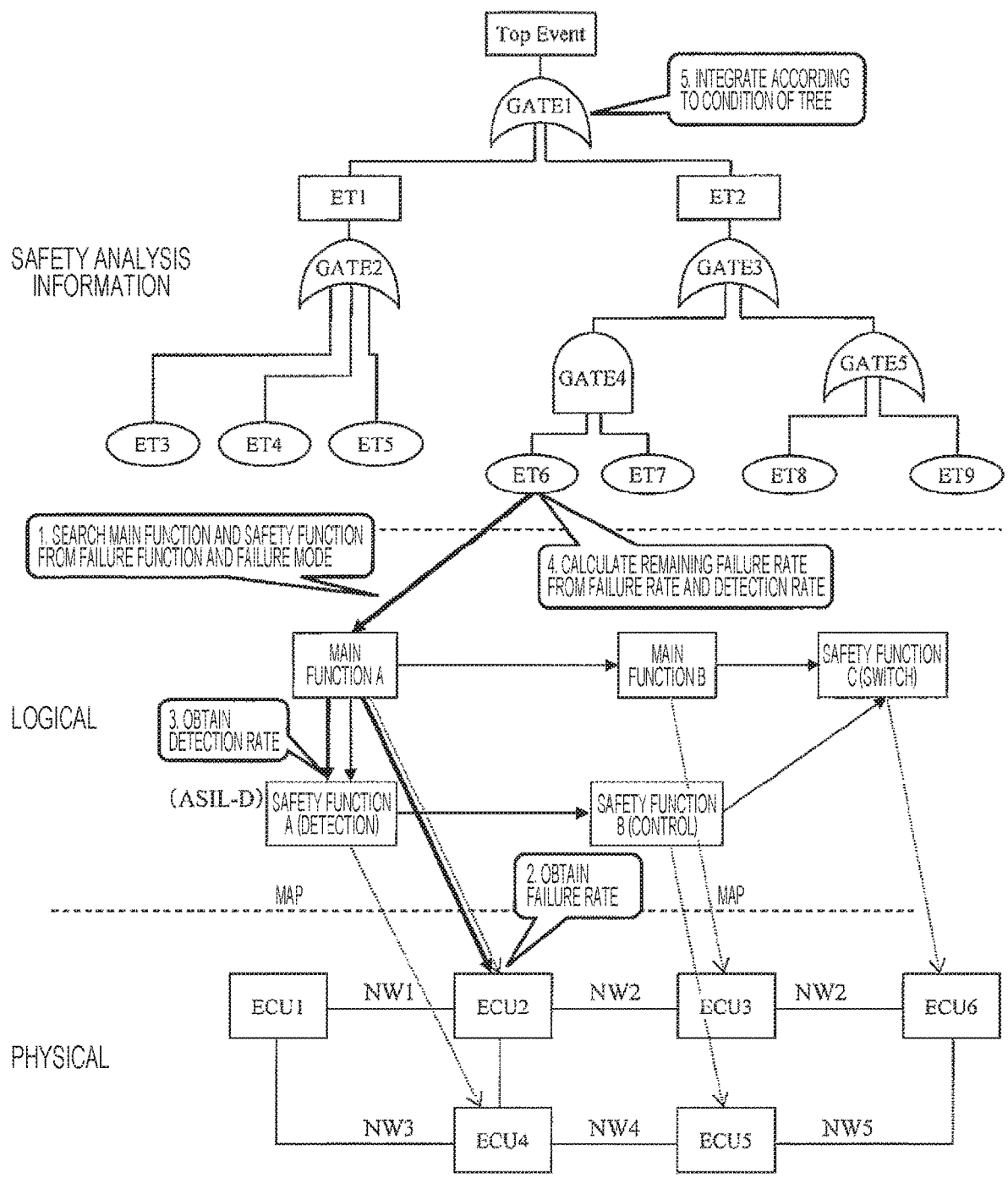
FIG. 13 is a diagram illustrating an outline of safety quantitative evaluation processing according to a second embodiment.

FIG. 13 is a diagram illustrating an outline of safety quantitative evaluation processing according to the second embodiment. The processing corresponds to processing for calculating probability of occurrence of the top event.

One of a plurality of events included in the FTA is selected, and a main function and a safety function are specified based on the detection target (refer to FIG. 7) of the logical function corresponding to the event and the failure function and the failure mode (refer to FIG. 10) of the logical function corresponding to the event.

The failure rate (refer to FIG. 5) of the physical element corresponding to the specified main function and the detection rate (refer to FIG. 7) of the safety function for detecting a failure of the main function are obtained.

Next, a remaining failure rate (ratio of failure rate which cannot be detected) is calculated from the obtained failure rate and detection rate.

Then, the remaining failure rate of each event is integrated according to the condition of the tree, and the occurrence probability of the top event is calculated.

<Details of Safety Quantitative Evaluation Processing (Top Event Occurrence Probability Calculation Processing)>

Figure 14:
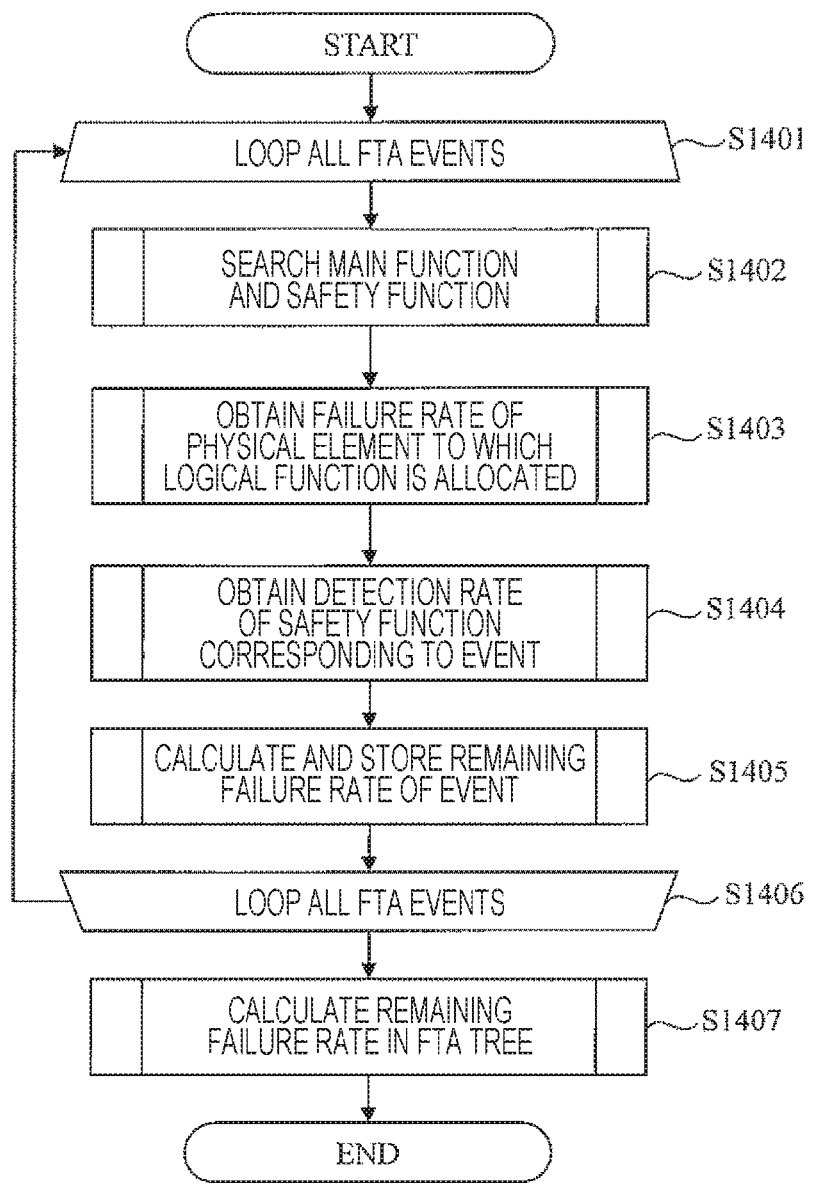
FIG. 14 is a flowchart for explaining details of the safety quantitative evaluation processing according to the second embodiment.

FIG. 14 is a flowchart for explaining details of the safety quantitative evaluation processing according to the second embodiment. An architecture quantitative evaluation unit 103 calculates an occurrence probability (remaining failure rate) of a hazard (top event) according to the following procedure. Here, a content of the processing to be executed by the architecture quantitative evaluation unit 103 as a program will be described. However, since the program is read and executed by the processor of a vehicle control system verification device 100, the architecture quantitative evaluation unit 103 can be replaced with the "processor".

(i) Steps 1401 and 1406

The architecture quantitative evaluation unit 103 repeats the processing in steps 1402 to 1405 on all the events of safety analysis information (FTA).

(ii) Step 1402

The architecture quantitative evaluation unit 103 searches the main function and the safety function of the event to be processed. Regarding the main function, since a logical function (main function) to be detected (in other word, monitored) is described in the detection target of the logical function (safety function) corresponding to the event, this information is extracted (main function A in example in FIG. 13).

Regarding the safety function, the corresponding safety function (here, safety function A) is specified based on the failure function and the failure mode (refer to FIG. 10) of the event to be processed.

(iii) Step 1403

The architecture quantitative evaluation unit 103 obtains a failure rate corresponding to the failure mode that is a failure rate (refer to FIG. 5) described in a parameter of an ECU or a microcomputer (here, ECU 2) in which the main function A is allocated.

(iv) Step 1404

The architecture quantitative evaluation unit 103 obtains the detection rate of the searched safety function (safety function A) from the parameter of the safety function (refer to FIG. 7).

(v) Step 1405

The architecture quantitative evaluation unit 103 calculates a remaining failure rate of the event to be processed by applying the obtained failure rate and detection rate to (Expression 1).

$$\text{Remaining failure rate} = \text{failure rate} \times (1 - \text{detection rate}) \quad \text{(Expression 1)}$$

Here, the calculation is performed as assuming that the detected failure be reliably processed. In a case where there is no corresponding safety function, calculation is performed as assuming that the detection rate be zero.

(vi) Step 1407

After calculating the remaining failure rates of all the events, the architecture quantitative evaluation unit 103 calculates the occurrence probability of the top event according to the structure of the FTA tree. Here, after the remaining failure rate of each event has been calculated, the occurrence probability of the top event is calculated according to the operation of the AND or OR gate. In addition, here, it is considered that all the events are independent from each other, the remaining failure rates of the events are added at the OR gate, and an occurrence rate of an upper event is calculated by multiplying the remaining failure rates of the events at the AND gate. In this way, the quantitative evaluation of the safety is performed.

In a case where the safety quantitative evaluation is performed in the safety requirement verification processing (step 1101), for example, the remaining failure rate of the hazard is compared with a required value for each hazard (for example, 10FIT in ASIL-D and the like). Then, it is determined that the verification is OK based on the result indicating that the remaining failure rate is equal to or less than the required value.

(3) Third Embodiment

A third embodiment discloses that processing for verifying safety function cooperation (safety function cooperation verification processing) is executed in safety verification processing. The third embodiment is different from the first embodiment in that the safety function cooperation verification processing is further executed in the safety verification processing in FIG. 11. Hereinafter, the safety verification processing according to the third embodiment will be described.

<Outline of Safety Verification Processing>

Figure 15:
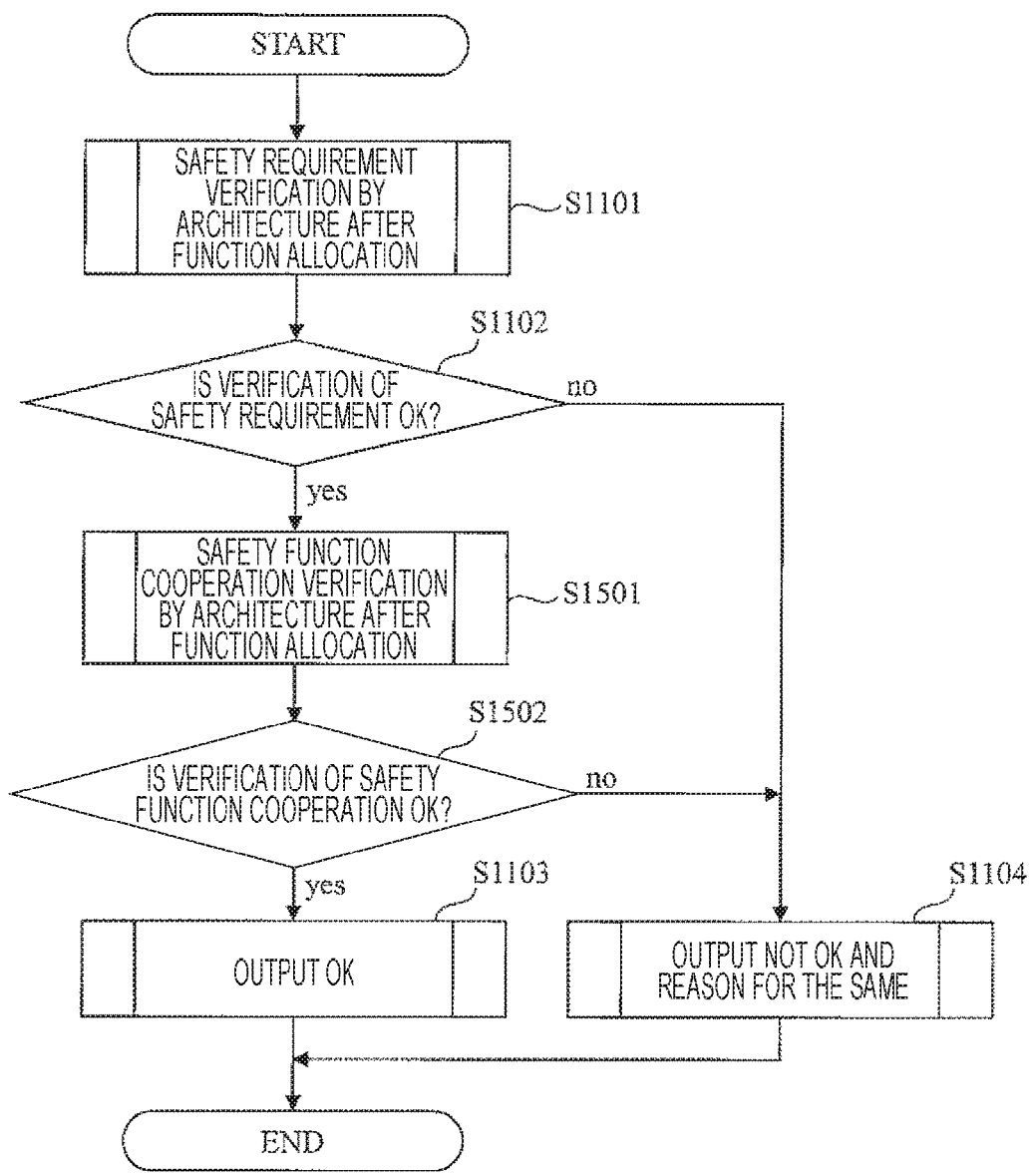
FIG. 15 is a flowchart for explaining an outline of safety verification processing according to a third embodiment.

FIG. 15 is a flowchart for explaining an outline of the safety verification processing according to the third embodiment. As illustrated in FIG. 15, steps 1501 and 1502 are added to the safety verification processing (FIG. 11: steps 1101 to 1104) according to the first embodiment. Only the added processing will be described below.

(i) Step 1501

A safety verification unit 102 verifies cooperation of safety functions in the physical architecture after allocation of a logical function. Details of the processing will be described later (refer to FIG. 16).

(ii) Step 1502

The safety verification unit 102 determines whether the verification result of the safety function cooperation is OK as a result of the processing in step 1501. In a case where desired safety function cooperation is performed (yes in step 1502), the processing proceeds to step 1103. In a case where the desired safety function cooperation is not performed (no in step 1502), the processing proceeds to step 1104.

<Details of Safety Function Cooperation Verification Processing>

Figure 16:
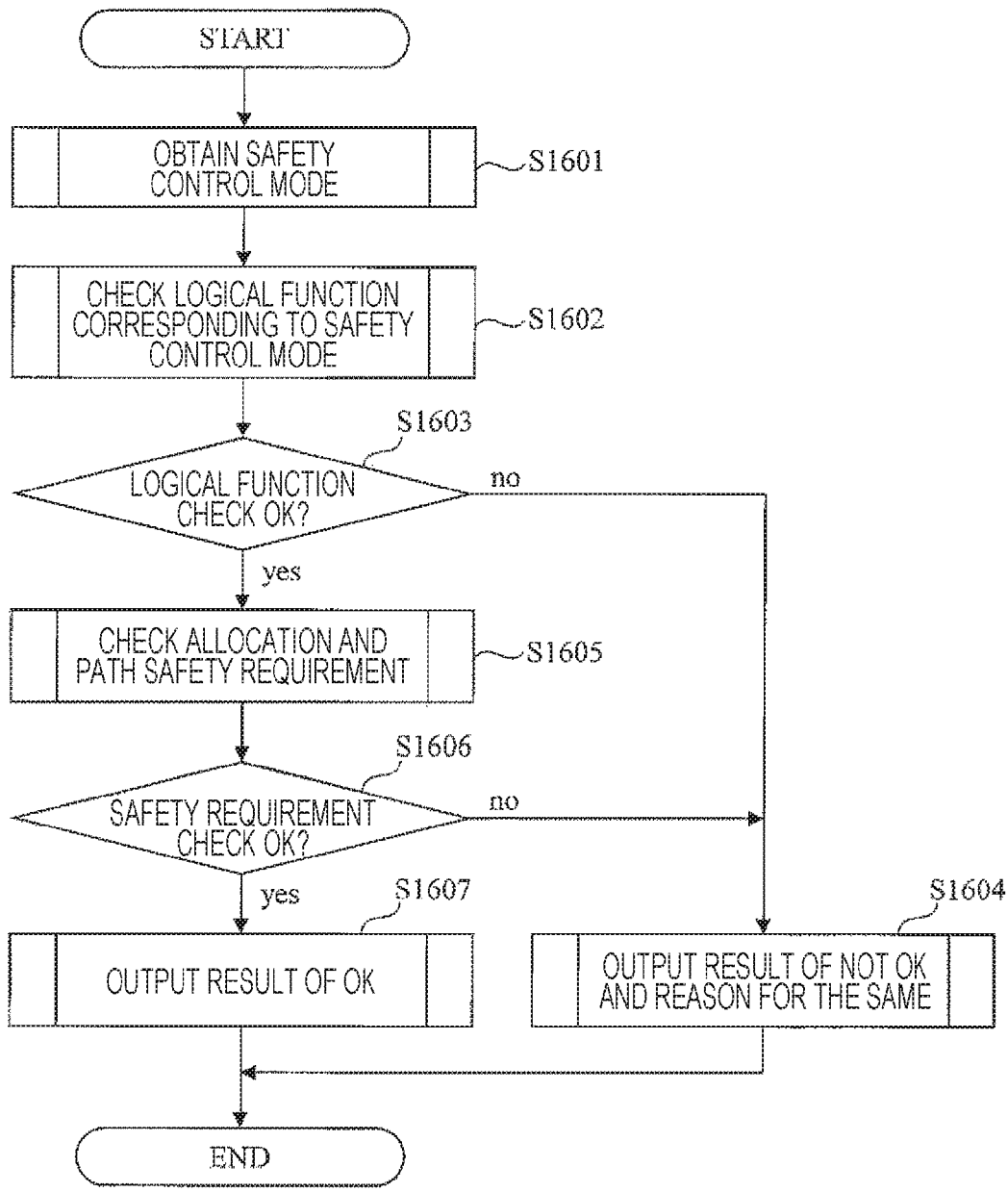
FIG. 16 is a flowchart for explaining details of safety function cooperation verification processing (step 1501).

FIG. 16 is a flowchart for explaining the details of the safety function cooperation verification processing (step 1501). The safety function cooperation verification processing to be executed by the safety verification unit 102 as a program will be described. However, since the program is read and executed by a processor of a vehicle control system verification device 100, the safety verification unit 102 can be replaced with the "processor".

(i) Step 1601

Since the safety function cooperation verification processing is executed for all safety functions of a logical architecture, the safety verification unit 102 obtains a safety control mode from a parameter of the safety function first. The safety control mode includes continuation of the function, safety stop, and the like, these kinds of information is obtained in correspondence with the safety function.

(ii) Step 1602

Figure 17A:
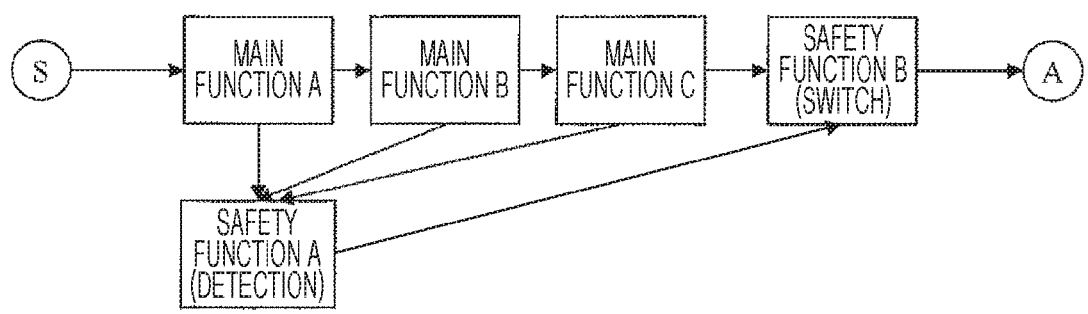
FIGS. 17A and 17B are diagrams illustrating an example of a safety control model.
Figure 17B:
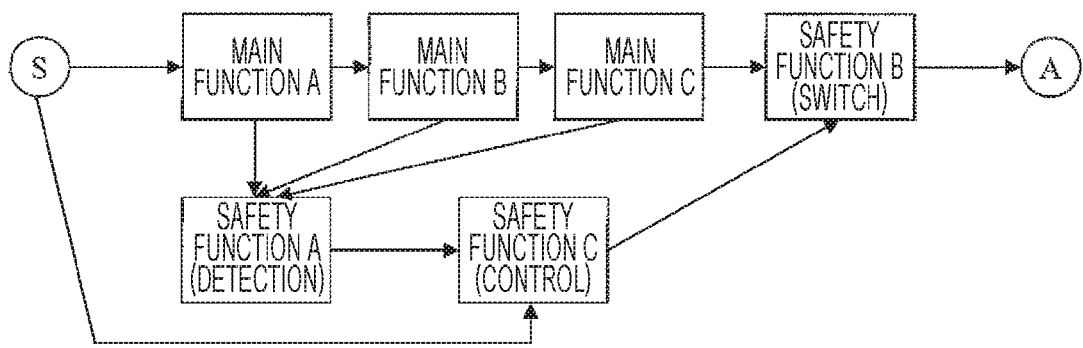

The safety verification unit 102 checks a logical function as to whether the safety function cooperation is correctly performed according to the safety control mode. Here, the check of the logical function means to compare the safety control model (refer to FIG. 7) with the cooperation of the safety functions as to whether cooperation of the logical functions corresponding to the obtained safety control mode is performed. FIG. 17 is a diagram illustrating an example of the safety control model. FIG. 17A illustrates the example of the safety control model corresponding to the "safety stop" of the safety control mode. FIG. 17B illustrates the example of the safety control model corresponding to the "continuation of the function" of the safety control mode. In FIG. 17, the reference "S" indicates Sensor, and the reference "A" indicates Actuator.

In the safety control model corresponding to the "safety stop" in FIG. 17A, the safety function (safety function A) having a "detection" function in a safety function type (refer to FIG. 7) of the parameter is coupled to main functions A, B, and C specified in the detection target (refer to FIG. 7) of the parameter. In addition, an output of the main function C is input to a safety function (safety function B) having a "switching function" in the safety function type (refer to FIG. 7). In a case where the "safety stop" is specified in the safety control mode, such cooperation is required. Therefore, the safety verification unit 102 checks whether such cooperation is established in the logical architecture.

In the safety control model corresponding to the "continuation of the function" in FIG. 17B, similarly, the safety function (safety function A) having the "detection" function in the safety function type (refer to FIG. 7) of the parameter is coupled to main functions A, B, and C specified in the detection target (refer to FIG. 7) of the parameter. On the other hand, in a case where "the function is continued", a safety function for performing control for "the continuation of the function" is required, and an output of the detection result is input to a safety function (safety function C) having a "control" function in the safety function type (refer to FIG. 7). The safety function C has an input (S) to perform the "control". Then, an output result of the safety function (safety function C) is input to the safety function (safety function B) for performing "switching". In a case where the "continuation of the function" is specified in the safety control mode, such cooperation is required. Therefore, the safety verification unit 102 checks whether such cooperation is established in the logical architecture.

(iii) Step 1603

The safety verification unit 102 determines whether the check result of the safety function cooperation in step 1602 is OK. In a case where the check result is not OK (no in step 1603), the processing proceeds to step 1604. In a case where the check result is OK (yes in step 1603), the processing proceeds to step 1605.

(iv) Step 1604

In a case where the result of the logical function check in step 1603 is not OK, the safety verification unit 102 outputs that the check result of the corresponding safety requirement is not OK and the reason for the same. In this case, the safety requirement that causes the logical function check result to be not OK and lacked information on cooperation of the logical function are output.

In a case where the check result of the safety requirement in step 1606 is not OK, the safety verification unit 102 outputs the result of not OK and the reason for the same. In this case, the safety requirements of which the safety degree and/or the multiplicity lacks and the information on the path are output as the reason for not OK.

(v) Step 1605

The safety verification unit 102 checks the safety requirement of the allocation destination and the path regarding the cooperation of the safety functions confirmed in step 1603.

Figure 18A:
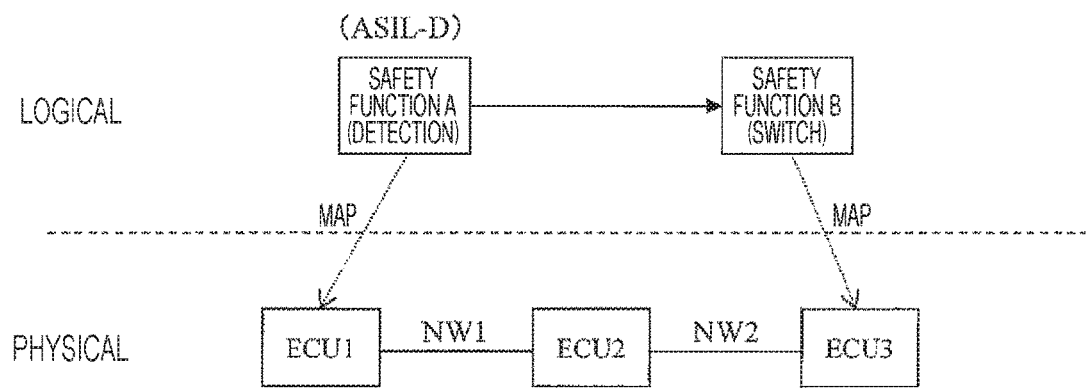
FIGS. 18A and 18B are diagrams illustrating an example of check of safety requirements of an allocation destination and a path regarding cooperation of safety functions.
Figure 18B:
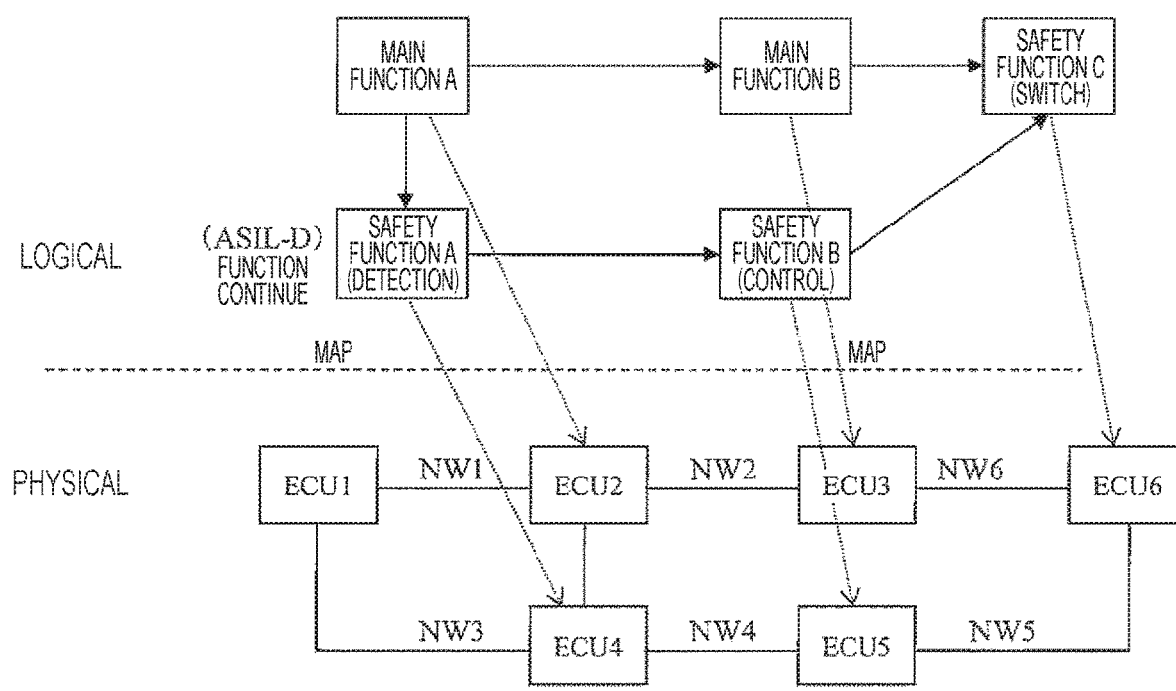

FIG. 18 is a diagram illustrating an example of check of the safety requirements of the allocation destination and the path regarding the cooperation of the safety functions. FIG. 18A illustrates an example in which the safety functions A and B are cooperated and a requirement of the safety degree of the function is ASIL-D. FIG. 18B illustrates an evaluation example in a case where the continuation of the function is further specified as the safety control mode of the safety function.

In a case of FIG. 18A, the safety verification unit 102 confirms whether an ECU 1 and an ECU 3 which are allocation destinations, and a network (NW) 1, an ECU 2, and a NW 2 between the ECUs 1 and 3 safety the requested safety degree (ASIL-D). Furthermore, the multiplicity is similarly confirmed. In this way, the safety requirements at the time of function cooperation are checked.

In a case of FIG. 18B, the functions are allocated as illustrated in FIG. 18B. Regarding cooperation of the safety functions, the safety degree is determined as in a case of FIG. 18A. Furthermore, in a case of FIG. 18B, a function for "the continuation of the function" is added. In a case of "the continuation of the function", redundant paths which are respectively independent for the main function and the safety function are required. This is because, in a case where the path of the main function cannot be used due to a failure and the like, it is necessary to realize a function similar to the main function having the failure through a different path. Therefore, the safety verification unit 102 searches a different path which is independent by using a path search algorithm. In a case where there are independent paths (two paths of ECU2→NW2→ECU3→NW6→ECU6 and ECU4→NW4→ECU5→NW5→ECU6 in FIG. 18B) and these paths satisfy a predetermined safety degree, it is determined that the check of the safety requirement is OK. Although "the different path" is indicated in the above, in addition to a case where completely different paths exist, a structure may be used in which a network and an ECU are made redundant (multiplexed therein). In this case, it can be determined whether the multiplicity of the physical element in the path exceeds the required multiplicity.

(vi) Step 1606

The safety verification unit 102 determines whether safety requirement check result of the safety function cooperation obtained in step 1605 is OK. In a case where the safety requirement check result is not OK (no in step 1606), the processing proceeds to step 1604. In a case where the safety requirement check result is OK (yes in step 1606), the processing proceeds to step 1607.

(vii) Step 1607

The safety verification unit 102 outputs the result of OK (that the result of safety requirement check of safety function cooperation is OK).

(4) Fourth Embodiment

A fourth embodiment discloses a structure for verifying safety of a vehicle control system in a vehicle control system.

<Configuration of Vehicle Control System>

Figures 19, 20A, 20B:
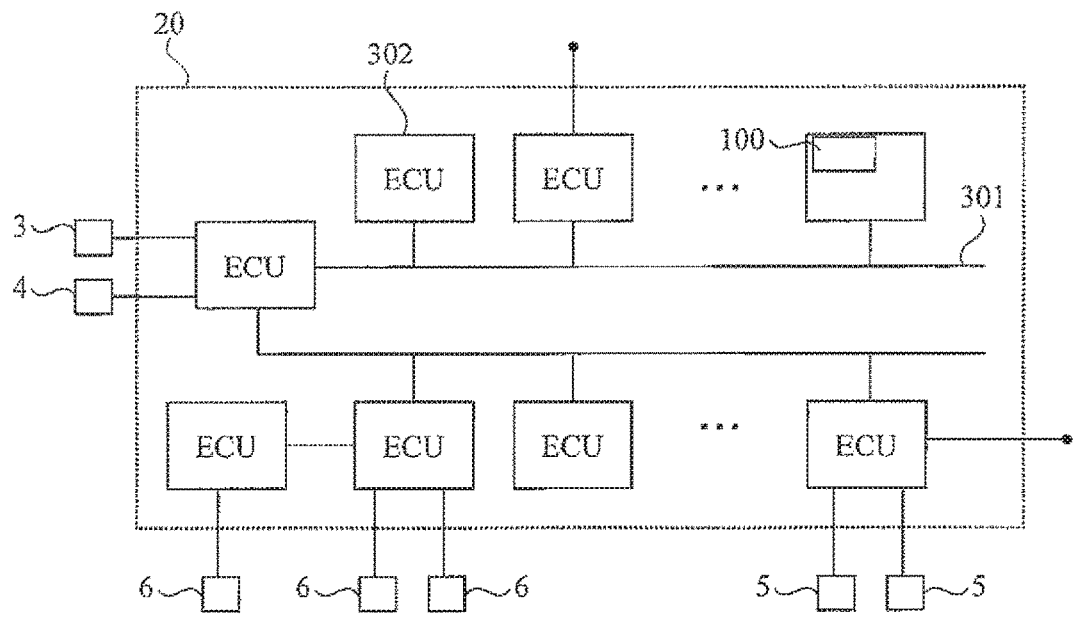
FIG. 19 is a diagram illustrating an exemplary configuration (physical architecture) of a vehicle control system according to a fourth embodiment.
FIGS. 20A and 20B are diagrams illustrating an example of architecture configuration information received by a vehicle control system verification device 100 in the fourth embodiment.

FIG. 19 is a diagram illustrating an exemplary configuration (physical architecture) of the vehicle control system according to the fourth embodiment. In FIG. 19, a vehicle control system verification device 100 illustrated in FIG. 1 is arranged in an ECU 302, and safety verification processing is executed in the vehicle control system on the basis of a FTA that is supplied. In the first to third embodiments, the safety verification processing is mainly executed at the time of design. However, in the fourth embodiment, since the vehicle control system verification device 100 is mounted in the vehicle control system, for example, the safety verification processing can be executed when a control program is rewritten.

In the fourth embodiment, the vehicle control system verification device 100 collects architecture information through a network link 301.

<Architecture Configuration Information>

FIG. 20 is a diagram illustrating an example of architecture configuration information received by the vehicle control system verification device 100 in the fourth embodiment. FIG. 20A illustrates physical architecture configuration information. FIG. 20B illustrates logical architecture configuration information.

The physical architecture configuration information (FIG. 20A) includes each physical element name (ECU and microcomputer), a network name connected to the physical element, various parameters of the physical element (refer to FIG. 5) as configuration items. The physical architecture information is constructed by collecting information owned by the ECUs from the plurality of ECUs by the vehicle control system verification device 100.

The logical architecture configuration information (FIG. 20B) includes each logical function name (ID), a physical element name (allocation place) which is allocated, and parameters of a logical architecture (refer to FIG. 7) as configuration items. The logical architecture information is constructed by collecting information owned by the ECUs from the plurality of ECUs by the vehicle control system verification device 100.

The vehicle control system verification device 100 collects safety analysis information which has been previously held by the ECU 302 and the network link 301 in addition to the physical architecture configuration information and the logical architecture information. Then, the vehicle control system verification device 100 executes processing of vehicle control system verification and safety verification and outputs the verification result to a network and the like. As a result, it is possible to constantly verify the safety regarding the state of the vehicle control system.

It is not necessary to obtain entire information of the physical architecture configuration information, the logical architecture configuration information, and the safety analysis information obtained in the network, and it is possible that the vehicle control system verification device 100 obtains only a difference, updates the difference, and makes determination. With this operation, a communication amount can be reduced.

(5) Summary (i) The vehicle control system verification device according to the present disclosure verifies whether a logical architecture of a vehicle control system has a logical function (safety function) corresponding to the safety analysis result on the basis of the safety analysis result information that is supplied. With this verification, safety of an architecture of the vehicle control system can be comprehensively (not partly) verified. The logical architecture may be constructed based on safety analysis result (FTA) information. Accordingly, it is possible to verify whether an architecture which has been set to satisfy requirements of the safety analysis result can actually cope with the safety analysis result. Furthermore, the vehicle control system verification device verifies whether the physical architecture in which the logical architecture is allocated satisfies a safety degree and a multiplicity required by the logical architecture. Accordingly, not only the safety on the logical architecture but also the safety on the physical architecture can be verified. Furthermore, for example, when the safety analysis result is the FTA, by determining whether a top event occurs when the result of safety verification of the logical architecture corresponding to a plurality of events in the FTA and the result of safety verification of the physical architecture are applied to the FTA, it is possible to effectively evaluate whether the designed architecture is appropriate.

In addition, the vehicle control system verification device according to the present disclosure performs quantitative evaluation on the physical architecture (for example, including a plurality of physical elements and network). Specifically, by calculating a use rate of a plurality of physical elements and an occupancy rate of the network when the logical architecture is allocated in the physical element, the quantitative evaluation of the physical architecture can be performed.

(ii) As another form of the quantitative evaluation, the vehicle control system verification device according to the present disclosure calculates a remaining failure rate of a logical function of a logical architecture corresponding to each event in the logical architecture for each of the plurality of events of the FTA from a failure rate and a detection rate that are parameters of the logical function and calculates a remaining failure rate of a top event by applying the remaining failure rate of the logical function corresponding to each event to the FTA. With this calculation, even when the safety function is appropriate, a probability that a top event (for example, dangerous failure) occurs can be provided. Based on the result, it is possible to consider whether further improvement is required for the architecture (lowering failure rate and raising detection rate).

(iii) The vehicle control system verification device according to the present disclosure checks whether the logical functions operate in cooperation with each other in accordance with a safety control mode indicating a control content to be realized by the logical architecture at the time of occurrence of an abnormality. For example, in a case where the safety control mode is safety stop, it is checked whether a safety function having a function for detecting an abnormality, a main function of which the abnormality is detected, a safety function having a switching function operate in cooperation with each other. In a case where the safety control mode is continuation of the function, it is checked whether the safety function having the function for detecting an abnormality, the main function of which the abnormality is detected, and a safety function having a function for performing alternative control, and the safety function having the switching function operate in cooperation with each other. With this operation, it is possible to verify cooperation of the safety functions in the architecture. Furthermore, it is possible to verify cooperation of the functions according to the kind of the safety control mode.

(iv) The vehicle control system verification device according to the present disclosure can be allocated in the physical architecture of the vehicle control system. In this case, the vehicle control system verification device obtains information on the logical architecture and the physical architecture in the vehicle control system and safety analysis result information which are input from outside and verifies the safety of the architecture based on the obtained information. For example, it is verified whether the logical architecture has a logical function (safety function) corresponding to the safety analysis result (FTA). Regarding the physical architecture, whether the required safety degree and multiplicity are satisfied is verified.

In this way, by mounting the vehicle control system verification device in the vehicle control system, it is possible to verify the safety of the vehicle control system, for example, in a case where a control program is rewritten.

(v) The embodiments of the present disclosure can be realized by a program code of software for realizing the functions. In this case, a storage medium recording the program code is provided in a system or a device, and a computer (or CPU and MPU) of the system or the device reads the program code stored in the storage medium. In this case, the program code read from the storage medium realizes the functions of the embodiments described above, and the program code itself and the storage medium storing the program code are included in the present invention. As a storage medium for supplying such as program code, for example, a flexible disk, a CD-ROM, a DVD-ROM, a hard disk, an optical disk, a magneto-optical disk, a CD-R, a magnetic tape, a nonvolatile memory card, a ROM, and the like are used.

Furthermore, based on an instruction of the program code, it is possible that an operating system (OS) and the like operating in the computer executes a part of or all of the actual processing and the processing realizes the functions of the embodiments. Furthermore, after the program code read from the storage medium has been written in a memory of the computer, based on the instruction of the program code, it is possible that a CPU and the like of the computer performs a part of or all of the actual processing and the processing realizes the functions of the embodiments.

Furthermore, the program code of software for realizing the function of the embodiment is distributed via the network so that the distributed program code is stored in a storage unit such as a hard disk, a memory, and the like of the system and the device or the storage medium such as a CD-RW and a CD-R, and the computer (or CPU and MPU) may read and execute the program code stored in the storage unit and the storage medium at the time of using the program code.

Finally, it is necessary to understand that the process and the technology described here are not substantially related to any specific device and can be implemented by any suitable combination of the components. In addition, various types of general-purpose devices can be used according to the description here. It may be found that construction of a dedicated device is useful for performing steps of the method described here. Furthermore, various inventions can be formed by an appropriate combination of a plurality of components disclosed in the embodiments. For example, some components can be deleted from all the components indicated in the embodiments. In addition, components in different embodiments may be appropriately combined. The present disclosure has been described with reference to the specific examples. However, the specific examples are described for description rather than limitation in all aspects. Those skilled in the art will understand that there are numerous combinations of hardware, software, and firmware suitable for implementing the present disclosure. For example, the described software can be implemented by a program or a script language in a wide range such as assembler, C/C++, perl, Shell, PHP, and Java (registered trademark).

Furthermore, in the embodiments, a control line and an information line which are considered to be necessary for description are illustrated, and all the control lines and information lines are not necessarily illustrated in a product. All the configurations may be mutually connected.

In addition, other implementations of the present disclosure will be apparent to a person having ordinary skill in the art from consideration of the specification and the embodiments of the present disclosure. Various aspects and/or components according to the described embodiments can be used alone or in any combination. The specification and the specific examples are only exemplary, and the scope and the idea of the present disclosure are indicated in claims below.

REFERENCE SIGNS LIST 1 vehicle system
2 vehicle control system
3 communication device
4 vehicle control system
5 driving device
6 recognition device
7 output device
8 input device
9 notification device
20 physical architecture
100 vehicle control system verification device
101 function allocation unit
102 safety verification unit
103 architecture quantitative evaluation unit
300 physical architecture
301 network link
302 ECU
401 processor
402 I/O device
403 timer
404 ROM
405 RAM
406 internal bus
601 logical architecture
602 integration recognition unit
603 automatic drive control unit
604 user input unit
605 output management unit
606 notification management unit
607 abnormality detection unit
608 switching unit
609 motion control unit
610 safety control unit
900 safety analysis information
901 top event
902 gate
903 event

The invention claimed is:

1. A vehicle control system verification device comprising:
   a storage device that stores a program configured to verify safety of a logical architecture of a vehicle control system; and
   a processor that reads the program from the storage device and verifies the safety of the logical architecture, wherein
   the processor executes first verification processing configured to verify whether the logical architecture has a logical function corresponding to a safety analysis result on the basis of safety analysis result information that is supplied,
   the processor is also configured to: i) obtain information on a safety control mode indicating a control content that is realized by the logical architecture at a time when an abnormality occurs in the vehicle control system, and ii) check whether logical functions of the logical architecture corresponding to the safety control mode operate in cooperation with each other,
   the logical architecture is allocated in a physical architecture of the vehicle control system,
   the physical architecture includes a plurality of physical elements and a network, and
   the processor performs quantitative evaluation of the physical architecture by calculating a use rate of the plurality of physical elements and a occupancy rate of the network when the logical architecture is allocated in the physical element in the processing for performing the quantitative evaluation.

2. The vehicle control system verification device according to claim 1, wherein
   the logical architecture is constructed on the basis of the safety analysis result information.

3. The vehicle control system verification device according to claim 1, wherein
   the processor further executes second verification processing for verifying whether the physical architecture satisfies a safety degree and a multiplicity required by the logical architecture.

4. The vehicle control system verification device according to claim 3, wherein
   the safety analysis result information is a FTA that expresses a relationship between an occurrence of a plurality of events and an occurrence of a top event which is the final result as a tree structure, and
   the processor further executes
   processing for determining whether the top event occurs when the result of the first verification processing corresponding to the plurality of events in the FTA and the result of the second verification processing are applied to the FTA, and
   processing for outputting the result of the determining processing.

5. The vehicle control system verification device according to claim 4, wherein
   in a case where the result of the determining processing indicates the occurrence of the top event, the processor further executes processing for performing quantitative evaluation of the physical architecture.

6. The vehicle control system verification device according to claim 5, wherein
   in the processing for performing the quantitative evaluation, the processor executes
   processing for calculating a remaining failure rate of a logical function of the logical architecture corresponding to each event in the logical architecture for each of the plurality of events from a failure rate and a detection rate that are parameters of the logical function, and
   processing for calculating a remaining failure rate of the top event by applying the calculated remaining failure rate of the logical function corresponding to each event to the FTA.

7. The vehicle control system verification device according to claim 1, wherein
   the logical function of the logical architecture includes a main function to realize a predetermined function in the vehicle control system and a safety function to cope with the abnormality in the vehicle control system, and
   when the cooperation operation of the logical functions is checked, in a case where the safety control mode is safety stop, the processor determines whether cooperation among a safety function having a function for detecting an abnormality, a main function of which an abnormality is detected, and a safety function having a switching function is constructed in the logical architecture.

8. The vehicle control system verification device according to claim 1, wherein
the logical function of the logical architecture includes a main function to realize a predetermined function in the vehicle control system and a safety function to cope with the abnormality in the vehicle control system, and
when the cooperation operation of the logical functions is checked, in a case where the safety control mode is continuation of the function, the processor determines whether cooperation among a safety function having a function for detecting an abnormality, a main function of which an abnormality is detected, a safety function having a function for performing alternative control, and a safety function having a switching function is constructed in the logical architecture.

9. A vehicle control system comprising the vehicle control system verification device according to claim 1, wherein
the vehicle control system verification device is allocated in a physical element forming a physical architecture of the vehicle control system, and
the vehicle control system verification device verifies whether the logical architecture has a logical function corresponding to the safety analysis result on the basis of information on the logical architecture and the physical architecture of the vehicle control system and the safety analysis result information to be input.

10. A vehicle control system verification method to verify a safety of an architecture of a vehicle control system, the method comprising:

obtaining a logical architecture and a physical architecture of the vehicle control system to be input by a processor;
obtaining safety analysis result information to be input by the processor;
reading a program to verify at least the safety of the logical architecture from a storage device and verifying whether the logical architecture has a logical function corresponding to the safety analysis result on the basis of the safety analysis result information by the processor;
obtaining information on a safety control mode indicating a control content that is realized by the logical architecture at a time when an abnormality occurs in the vehicle control system;
checking whether logical functions of the logical architecture corresponding to the safety control mode operate in cooperation with each other, wherein
the logical architecture is allocated in the physical architecture of the vehicle control system,
the physical architecture includes a plurality of physical elements and a network, and
performing, using the processor, quantitative evaluations of the physical architecture by calculating a use rate of the plurality of physical elements and an occupancy rate of the network when the logical architecture is allocated in the physical element in the processing for performing the quantitative evaluation.

* * * * *